US012751050B2

(12) United States Patent
Yang et al.

(10) Patent No.: US 12,751,050 B2
(45) Date of Patent: Sep. 29, 2026

(54) SEMICONDUCTOR DEVICE AND METHOD OF MANUFACTURING THE SAME

(71) Applicant: Samsung Electronics Co., Ltd., Suwon-si (KR)

(72) Inventors: Jeeeun Yang, Suwon-si (KR); Sangwook Kim, Suwon-si (KR); Euntae Kim, Suwon-si (KR); Kwanghee Lee, Suwon-si (KR); Moonil Jung, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 278 days.

(21) Appl. No.: 18/479,428

(22) Filed: Oct. 2, 2023

(65) Prior Publication Data

US 2024/0120421 A1 Apr. 11, 2024

(30) Foreign Application Priority Data

Oct. 6, 2022 (KR) ........................ 10-2022-0128145
Sep. 19, 2023 (KR) ........................ 10-2023-0124993

(51) Int. Cl.
*H10D 30/67* (2025.01)
*H10D 30/01* (2025.01)

(52) U.S. Cl.
CPC ....... *H10D 30/6755* (2025.01); *H10D 30/031* (2025.01); *H10D 30/673* (2025.01)

(58) Field of Classification Search
CPC ............. H10D 30/6755; H10D 30/025; H10D 64/667; H10D 64/62; H10D 30/6757; C23C 14/086
See application file for complete search history.

(56) References Cited

U.S. PATENT DOCUMENTS

| | | | |
|---|---|---|---|
| 7,160,819 B2 | 1/2007 | Conley, Jr. et al. |
| 8,003,450 B2 | 8/2011 | Jeong et al. |
| 8,410,838 B2 | 4/2013 | Kato et al. |
| 8,559,220 B2 | 10/2013 | Yamazaki et al. |

(Continued)

FOREIGN PATENT DOCUMENTS

| | | | |
|---|---|---|---|
| JP | 2022-049605 A | 3/2022 |
| KR | 10-2018-0020157 A | 2/2018 |

(Continued)

OTHER PUBLICATIONS

Extended European Search Report dated Mar. 5, 2024 for corresponding European Application No. 23200161.0.

(Continued)

*Primary Examiner* — Edward Chin
(74) *Attorney, Agent, or Firm* — Harness, Dickey & Pierce, P.L.C.

(57) ABSTRACT

A semiconductor device and a method of manufacturing the same are provided. The semiconductor device includes a lower electrode provided on a substrate, a buffer layer provided on the lower electrode and including first indium, an oxide semiconductor layer provided on the buffer layer and including second indium, a gate electrode provided apart from the oxide semiconductor layer, and an upper electrode provided on the oxide semiconductor layer, wherein a content of the first indium is greater than a content of the second indium.

26 Claims, 33 Drawing Sheets

(56) References Cited

U.S. PATENT DOCUMENTS

| | | | |
|---|---|---|---|
| 8,748,901 | B1 | 6/2014 | Takahashi et al. |
| 8,883,556 | B2 | 11/2014 | Yamazaki |
| 9,177,872 | B2 | 11/2015 | Sandhu |
| 9,431,441 | B1 | 8/2016 | Zhou et al. |
| 9,564,217 | B1 | 2/2017 | Zhou et al. |
| 9,691,905 | B2 | 6/2017 | Ito et al. |
| 9,711,549 | B2 | 7/2017 | Yamazaki et al. |
| 9,882,056 | B2 | 1/2018 | Lee et al. |
| 10,192,913 | B2 | 1/2019 | Kurokawa |
| 10,236,033 | B2 | 3/2019 | Koyama et al. |
| 10,347,637 | B2 | 7/2019 | Sandhu |
| 10,483,401 | B2 | 11/2019 | Bu |
| 10,522,693 | B2 | 12/2019 | Kurokawa |
| 11,017,843 | B2 | 5/2021 | Sharma et al. |
| 11,139,396 | B2 | 10/2021 | Karda et al. |
| 11,335,788 | B2 | 5/2022 | Ramaswamy et al. |
| 11,430,895 | B2 | 8/2022 | Karda et al. |
| 2020/0044095 | A1 | 2/2020 | Wang et al. |
| 2020/0091156 | A1 | 3/2020 | Sharma et al. |
| 2020/0111908 | A1* | 4/2020 | Sills ....................... H10D 30/63 |
| 2021/0367080 | A1 | 11/2021 | Lee et al. |
| 2022/0085212 | A1 | 3/2022 | Sato et al. |
| 2022/0223734 | A1 | 7/2022 | Yoon |
| 2025/0006844 | A1 | 1/2025 | Yang et al. |

FOREIGN PATENT DOCUMENTS

| | | | |
|---|---|---|---|
| KR | 10-2142477 | B1 | 8/2020 |
| WO | 2013/001782 | A1 | 1/2013 |

OTHER PUBLICATIONS

Xinlv Duan et al., "Novel Vertical Channel-All-Around(CAA) IGZO FETs for 2T0C DRAM with High Density beyond 4F2 by Monolithic Stacking", Huawei Technologies (IEDM 2021).

* cited by examiner

SEMICONDUCTOR DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2022-0128145, filed on Oct. 6, 2022 in the Korean Intellectual Property Office, and Korean Patent Application No. 10-2023-0124993, filed on Sep. 19, 2023 in the Korean Intellectual Property Office, the disclosure of which is incorporated by reference herein in its entirety.

BACKGROUND

1. Field

The inventive concepts relate to semiconductor devices including an indium-containing buffer layer and methods of manufacturing the same.

2. Description of the Related Art

A transistor is a semiconductor device operating as an electrical switch and is employed in various integrated circuit (IC) devices including memory, driving ICs, logic devices, and the like. In order to increase the degree of integration of integrated circuit devices, the space occupied by transistors included therein has been rapidly reduced, and thus, research has been conducted to reduce the size of transistors while maintaining the performance thereof.

One of the elements of a transistor is a gate electrode. When a voltage is applied to the gate electrode, a channel adjacent to a gate opens a current path, and in the opposite case, blocks the current. The performance of a semiconductor depends on how much and how efficiently a leakage current is reduced and managed in the gate electrode and the channel. The larger the contact area between the gate electrode, which controls the current, and the channel in a transistor, the higher the power efficiency.

As the degree of scaling of the semiconductor processes is increased, the size of a transistor decreases and the contact area between the gate electrode and the channel decreases, causing problems due to a short channel effect. For example, phenomena such as threshold voltage variation, carrier velocity saturation, and deterioration of the subthreshold characteristics may occur. Accordingly, a method of overcoming the short channel effect and effectively reducing the channel length is searched.

SUMMARY

Some example embodiments of the inventive concepts include one or more semiconductor devices including an indium-containing buffer layer.

Some example embodiments of the inventive concepts include one or more methods of manufacturing semiconductor devices including an indium-containing buffer layer.

Some example embodiments will be set forth in part in the description which follows and, in part, will be apparent from the description, or may be learned by practice of the presented embodiments of the inventive concepts.

According to some example embodiments, a semiconductor device includes a substrate, a lower electrode on the substrate, a first buffer layer on the lower electrode, the first buffer layer including first indium, an oxide semiconductor layer on the first buffer layer, the oxide semiconductor layer including second indium, a gate insulating layer on the oxide semiconductor layer, a gate electrode on the gate insulating layer, and an upper electrode on the oxide semiconductor layer, wherein a content of the first indium in the first buffer layer is greater than a content of the second indium in the oxide semiconductor layer, wherein the first buffer layer is between the lower electrode and the oxide semiconductor layer, and wherein the upper electrode and the lower electrode are spaced apart from each other in a perpendicular direction extending perpendicular to the substrate.

The first buffer layer may be in contact with each of the lower electrode and the oxide semiconductor layer.

The first buffer layer may include at least one of InGaZnO, InGaO, InSnO, InZnO, and InO.

The lower electrode may include Zn having a content of 10 at % or less.

Zn content in the first buffer layer may be less than the content of the first indium in the first buffer layer.

The first buffer layer may have a thickness in a range from about 1 Å to about 50 Å.

The oxide semiconductor layer may include an oxide including at least one of Zn, Sn, Ga, and Hf.

The content of second indium in the oxide semiconductor layer may be greater in an area relatively close to the first buffer layer than in an area relatively far from the first buffer layer.

The semiconductor device may further include a metal oxide layer between the lower electrode and the first buffer layer, wherein the metal oxide layer includes a same metal as a metal included in the lower electrode.

The oxide semiconductor layer may include InGaZnO, ZrInZnO, $InGaZnO_4$, ZnInO, $In_2O_3$, HfInZnO, or any combination thereof.

The oxide semiconductor layer may include the second indium and zinc (Zn), and a content of the second indium in the oxide semiconductor layer may be greater than or equal to a content of Zn in the oxide semiconductor layer.

The lower electrode may include at least one of tungsten (W), cobalt (Co), nickel (Ni), iron (Fe), titanium (Ti), molybdenum (Mo), chromium (Cr), zirconium (Zr), hafnium (Hf), niobium (Nb), tantalum (Ta), silver (Ag), gold (Au), aluminum (Al), copper (Cu), tin (Sn), vanadium (V), ruthenium (Ru), platinum (Pt), zinc (Zn), or magnesium (Mg).

The gate electrode may surround a circumference of the oxide semiconductor layer.

The semiconductor device may further include a second buffer layer between the oxide semiconductor layer and the upper electrode.

The first buffer layer may be in contact with a side surface of the lower electrode, and at least a portion of the oxide semiconductor layer may be offset from the lower electrode and the upper electrode in a horizontal direction that extends parallel with the substrate, and the portion of the oxide semiconductor layer may extend in the perpendicular direction between at least a position that overlaps the lower electrode in the horizontal direction and another position that overlaps the upper electrode in the horizontal direction.

The oxide semiconductor layer, the gate insulating layer, and the gate electrode may be arranged such that the oxide semiconductor layer, the gate insulating layer, and the gate electrode have respective length directions that are parallel with each other and parallel to the perpendicular direction, and the oxide semiconductor layer, the gate insulating layer, and the gate electrode may be arranged in a horizontal direction extending parallel with the substrate such that the oxide semiconductor layer, the gate insulating layer, and the gate electrode at least partially overlap with each other in the horizontal direction.

The oxide semiconductor layer may have a U-shaped cross-section.

The oxide semiconductor layer may include a first oxide semiconductor layer that has an L-shape having a length dimension and a width dimension extending perpendicular to each other such that the length dimension of the first oxide semiconductor layer extends in the perpendicular direction, and a second oxide semiconductor layer that is symmetrically arranged with respect to the first oxide semiconductor layer with respect to the perpendicular direction such that the first and second oxide semiconductor layers have reflection symmetry around a first axis of symmetry that extends in the perpendicular direction, and the gate electrode may include a first gate electrode having a length dimension that extends in the perpendicular direction, and a second gate electrode that is symmetrically arranged with respect to the first gate electrode with respect to the perpendicular direction such that the first and second gate electrodes have reflection symmetry around a second axis of symmetry that extends in the perpendicular direction.

The lower electrode, the first buffer layer, and the oxide semiconductor layer may have a same width as each other.

According to some example embodiments, a method of manufacturing a semiconductor device, includes arranging a lower electrode on a substrate, depositing, on the lower electrode, a buffer layer including first indium, depositing, on the buffer layer, an oxide semiconductor layer including second indium, depositing a gate insulating layer on the oxide semiconductor layer, depositing a gate electrode on the gate insulating layer, and depositing an upper electrode on the oxide semiconductor layer, wherein a content of the first indium in the buffer layer is greater than a content of the second indium in the oxide semiconductor layer, wherein the buffer layer is between the lower electrode and the oxide semiconductor layer, and wherein the upper electrode and the lower electrode are spaced apart from each other in a perpendicular direction that extends perpendicular to the substrate.

BRIEF DESCRIPTION OF THE DRAWINGS

The above and other aspects, features, and advantages of certain embodiments of the inventive concepts will be more apparent from the following description taken in conjunction with the accompanying drawings, in which.

DETAILED DESCRIPTION

Figure 1A:
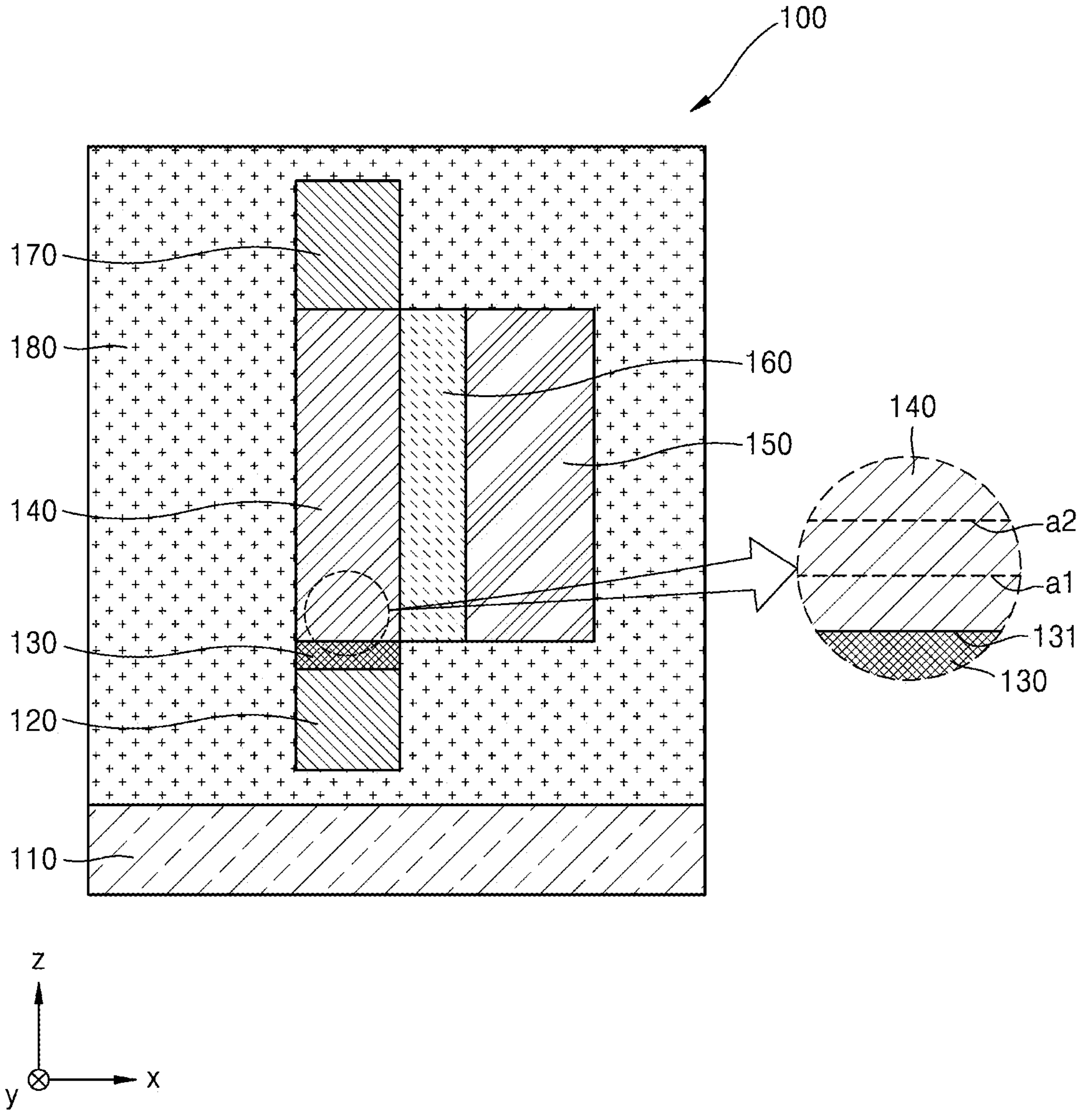
FIG. 1A illustrates a semiconductor device according to some example embodiments.

Reference will now be made in detail to example embodiments, some of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a semiconductor device according to some example embodiments and a method of manufacturing the same will be described with reference to the attached drawings. In the drawings, like reference numerals refer to like elements throughout and sizes of constituent elements may be exaggerated for convenience of explanation and the clarity of the specification. While such terms as "first," "second," etc., may be used to describe various elements, such elements must not be limited to the above terms. The above terms are used only to distinguish one element from another.

The singular forms include the plural forms unless the context clearly indicates otherwise. It should be understood that, when a part "comprises" or "includes" an element, unless otherwise defined, other elements are not excluded from the part and the part may further include other elements. In the drawings, sizes of constituent elements may be exaggerated for convenience of explanation and the clarity of the specification. It will also be understood that when an element is referred to as being "on" or "above" another element, the element may be in direct contact with the other element or other intervening elements may be present Also, in some example embodiments below, materials constituting respective layers are examples, and other materials may also be used.

Also, in the specification, the term " . . . units" or " . . . modules" denote units or modules that process at least one function or operation, and may be realized by hardware, software, or a combination of hardware and software.

The particular implementations shown and described herein are illustrative examples and are not intended to otherwise limit the scope of the inventive concepts in any way. For the sake of brevity, conventional electronics, control systems, software development and other functional aspects of the systems may not be described in detail. Furthermore, the connecting lines, or connectors shown in the various figures presented are intended to represent example functional relationships and/or physical or logical couplings between the various elements. It should be noted that many alternative or additional functional relationships, physical connections or logical connections may be present in a practical device.

The use of the terms "a" and "an" and "the" and similar referents are to be construed to cover both the singular and the plural.

The steps of all methods described herein can be performed in any suitable order unless otherwise indicated herein or otherwise clearly contradicted by context. The use of any and all examples, or example language (e.g., "such as") provided herein, is intended merely to better illuminate the inventive concepts and does not pose a limitation on the scope of the inventive concepts unless otherwise claimed.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words “about” and “substantially” are used in connection with geometric shapes, it is intended that precision of the geometric shape is not required but that latitude for the shape is within the scope of the disclosure. Further, regardless of whether numerical values or shapes are modified as “about” or “substantially,” it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established “by” or “through” performing additional operations, it will be understood that the operation may be performed and/or the effect/structure may be established “based on” the additional operations, which may include performing said additional operations alone or in combination with other further additional operations.

As described herein, an element that is described to be “spaced apart” from another element, in general and/or in a particular direction (e.g., vertically spaced apart, laterally spaced apart, etc.) and/or described to be “separated from” the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be “spaced apart” from each other, in general and/or in a particular direction (e.g., vertically spaced apart, laterally spaced apart, etc.) and/or are described to be “separated” from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

FIG. 1A illustrates a semiconductor device 100 according to some example embodiments.

Referring to FIG. 1A, the semiconductor device 100 may include a substrate 110, a lower electrode 120 provided on the substrate 110, a buffer layer 130 provided on the lower electrode 120, an oxide semiconductor layer 140 provided on the buffer layer 130, and an upper electrode 170 provided on the oxide semiconductor layer 140.

The substrate 110 may include an insulating substrate, or may include a semiconductor substrate having an insulating layer formed on a surface thereof. In some example embodiments, the substrate 110 may include a semiconductor substrate. The semiconductor substrate may include, for example, silicon (Si), germanium (Ge), SiGe or a III-V group semiconductor material. The substrate 110 may include, for example, a silicon substrate, on a surface of which silicon oxide is formed, but is not limited thereto.

The lower electrode 120 may include a metal material. The lower electrode 120 may include at least one selected from is tungsten (W), cobalt (Co), nickel (Ni), iron (Fe), titanium (Ti), molybdenum (Mo), chromium (Cr), zirconium (Zr), hafnium (Hf), niobium (Nb), tantalum (Ta), silver (Ag), gold (Au), aluminum (Al), copper (Cu), tin (Sn), vanadium (V), ruthenium (Ru), platinum (Pt), zinc (Zn), and magnesium (Mg). The lower electrode 120 may be arranged apart from the substrate 110. The lower electrode 120 may include Zn having a content of 10 at % or less. The content of Zn may be 10 at % or less with respect to the entire metal element in the lower electrode 120. Here, the Zn content may represent the content of Zn among all metal elements included in the lower electrode 120, excluding oxygen. Or the lower electrode 120 may include Zn having a content of 5 at % or less.

The buffer layer 130 may include an oxide containing first indium. The buffer layer 130 may include, for example, at least one of InGaZnO, InGaO, InSnO, InZnO, and InO. The buffer layer 130 may include a single layer or multiple layers (e.g., a first buffer layer and a second buffer layer). The buffer layer 130 may be interchangeably referred to herein as a first buffer layer. In the buffer layer 130, a Zn content may be less than a content of In.

The oxide semiconductor layer 140 may include an oxide containing second indium and may be used as a channel layer. A content of the first indium in the buffer layer 130 (e.g., a proportion of the buffer layer 130 comprised of indium) may be greater than a content of the second indium in the oxide semiconductor layer 140 (e.g., a proportion of the oxide semiconductor layer 140 comprised of indium). The content of second indium in the oxide semiconductor layer 140 may be greater in an area relatively close to the buffer layer 130 than in an area relatively far from the buffer layer 130. Referring to FIG. 1A, the content of second indium at a position a1 of the oxide semiconductor layer 140 is greater than the content of second indium at a position a2, and a1 and a2 are respectively positions at a distance a1 and a distance a2 from a boundary 131 between the buffer layer 130 and the oxide semiconductor layer 140, and a1<a2. Alternatively, the content of second indium in the oxide semiconductor layer 140 may have a gradient content distribution in which the content of the second indium gradually increases toward the buffer layer 130.

The buffer layer 130 may include $(In)_{a1}(M^1)_{a2}O$, and the oxide semiconductor layer 140 may include $(In)_{b1}(M^2)_{b2}O$. Here, $M^1$ and $M^2$ may include Zn, Sn, Ga, Hf, or any combination thereof, a1 may be a real number satisfying $0<a1\leq 10$, a2 may be a real number satisfying $0\leq a2\leq 10$, b1 may be a real number satisfying $0<b1\leq 10$, b2 may be a real number satisfying $0\leq b2\leq 10$, and a1>b1.

For example, when the oxide semiconductor layer 140 and the buffer layer 130 each include In, Ga, Zn, and O, the composition ratio of In, Ga, and Zn in the oxide semiconductor layer 140 may be 1:1:1, and the composition ratio of In, Ga, and Zn in the buffer layer 130 may be 2:1:1.

The oxide semiconductor layer 140 may include an indium (In)-containing oxide including at least one of Zn, Sn, Ga, or Hf. The oxide semiconductor layer 140 may include zinc indium oxide (ZIO), indium gallium oxide (IGO), or indium gallium zinc oxide (IGZO). The oxide semiconductor layer 140 may include a material selected from InGaZnO, ZrInZnO, $InGaZnO_4$, ZnInO, $In_2O_3$, HfInZnO, or any combination thereof. The oxide semiconductor layer 140 may include In and Zn, and an In content of the oxide semiconductor layer 140 (e.g., a proportion of the oxide semiconductor layer 140 comprised of In) may be greater than or equal to a Zn content of the oxide semiconductor layer 140 (e.g., a proportion of the oxide semiconductor layer 140 comprised of Zn). For example, the composition ratio of In and Zn in the oxide semiconductor layer may be equal to or greater than 1:1.

The oxide semiconductor layer 140 may include $(In)_{b1}(Zn)_{b2}(M^3)_{b3}O$. Here, $M^3$ may include Sn, Ga, Hf, or any combination thereof, b1 may be a real number satisfying $0<b1\leq 10$, b2 may be a real number satisfying $0<b2\leq 10$, b3 may be a real number satisfying $0\leq b3\leq 10$, and $b1>b2$.

Although not illustrated in FIG. 1A, a buffer layer (e.g., a second buffer layer) may be further provided between the oxide semiconductor layer 140 and the upper electrode 170.

The lower electrode 120 and the upper electrode 170 may be arranged apart from each other (e.g., spaced apart from each other) in a direction perpendicular to the substrate 110 (Z-direction), and the buffer layer 130 may be arranged between the lower electrode 120 and the oxide semiconductor layer 140. Accordingly, the lower electrode 120, the buffer layer 130, the oxide semiconductor layer 140, and the upper electrode 170 may be arranged in a line in the direction perpendicular to the substrate 110 (Z-direction). The lower electrode 120, the buffer layer 130, and the oxide semiconductor layer 140 may be sequentially arranged without other intervening layers. That is, the buffer layer 130 may be provided to be direct contact with both the lower electrode 120 and the oxide semiconductor layer 140. The lower electrode 120, the buffer layer 130, and the oxide semiconductor layer 140 may have the same width as one another.

As described herein, the direction perpendicular to the substrate 110 (Z-direction) may be interchangeably referred to as a "perpendicular direction," a "vertical direction," or the like which extends perpendicular to the substrate 110, for example extending perpendicular to an upper surface of the substrate 110 as shown in at least FIG. 1A.

The oxide semiconductor layer 140 may be arranged such that a length direction thereof is in the direction perpendicular to the substrate 110 (Z-direction). In this specification, a length direction of a component refers to a direction with a relatively long length of the component when viewed in the drawing. For example, where a component has a first dimension (e.g., a length) and a second dimension (e.g., a width) perpendicular to the first dimension, and where the first dimension is greater than the second dimension, the first dimension may be referred to as a long dimension, a length dimension, or the like of the component, and the second dimension may be referred to as a short dimension, a width dimension, or the like of the component. The length direction of the component may be understood to be a direction extending parallel to the length dimension of the component. The width direction of the component may be understood to be a direction extending parallel to the width dimension of the component.

A gate electrode 150 may be provided at one side of the oxide semiconductor layer 140. A gate insulating layer 160 may be provided between the oxide semiconductor layer 140 and the gate electrode 150. As shown in at least FIG. 1A, the gate electrode 150 may be arranged such that a length direction thereof (Z-direction) is in the direction perpendicular to the substrate 110 (e.g., is parallel to the perpendicular direction). The oxide semiconductor layer 140, the gate insulating layer 160, and the gate electrode 150 may be arranged in a line in a direction horizontal with the substrate 110 (X direction), for example arranged in a pattern extending in the direction horizontal with the substrate 110 (X direction), for example such that the oxide semiconductor layer 140, the gate insulating layer 160, and the gate electrode 150 at least partially overlap with each other in the direction horizontal with the substrate 110 (X direction) (e.g., entirely overlap with each other in the direction horizontal with the substrate 110 (X direction) as shown in FIG. 1A).

As described herein, the direction horizontal with the substrate 110 (X direction) may be referred to interchangeably as a "parallel direction," a "horizontal direction," or the like which extends parallel to the substrate 110, for example extending parallel to an upper surface of the substrate 110 as shown in at least FIG. 1A.

A mold insulating layer 180 may be provided on the substrate 110 to fill empty space. The lower electrode 120 may be apart (e.g., spaced apart) from the substrate 110 by the mold insulating layer 180. In some example embodiments, the mold insulating layer 180 may include an insulating material, for example silicon oxide.

As described above, as the semiconductor device 100 according to some example embodiments includes the buffer layer 130 containing indium, between the lower electrode 120 and the oxide semiconductor layer 140, the variation in a composition of an interface varying according to the type and state of a metal of the lower electrode 120 may be reduced, which may result in improved performance of the semiconductor device, for example due to reduced short-channel effect due to the presence of the buffer layer 130 including indium (e.g., first indium) between the lower electrode 120 and the oxide semiconductor layer 140 including indium (e.g., second indium), and a content of the indium (e.g., first indium) in the buffer layer 130 is greater than a content of the indium (e.g., second indium) in the oxide semiconductor layer 140 which may cause the reduced variation in the composition of the interface according to the type and state of a metal of the lower electrode 120.

Figure 1B:
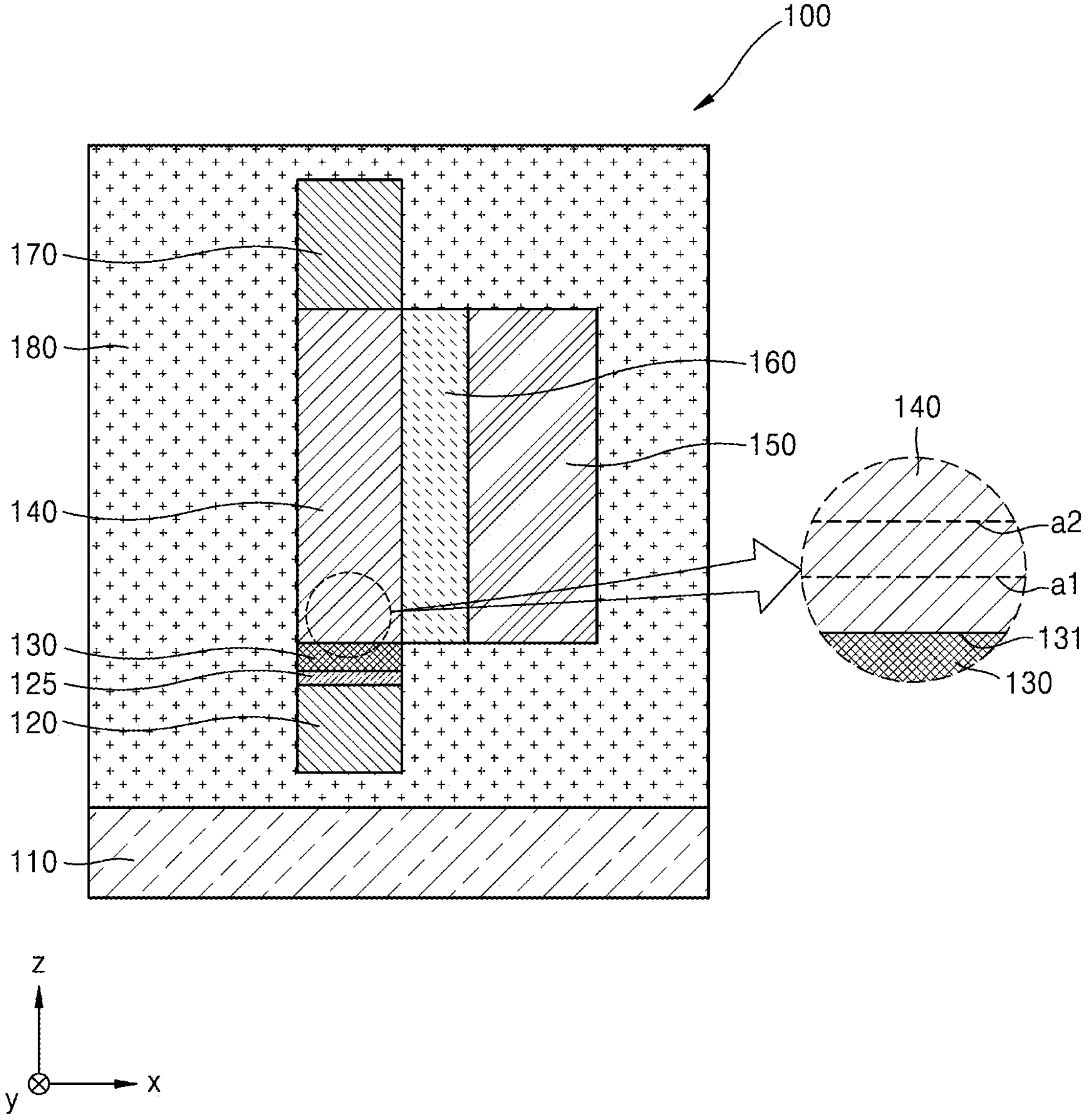
FIG. 1B illustrates an example in which a metal oxide layer is further included in the semiconductor device of FIG. 1A.

FIG. 1B illustrates an example in which the semiconductor device illustrated in FIG. 1A includes a metal oxide layer. The semiconductor device 100 may include a metal oxide layer 125 provided between the lower electrode 120 and the buffer layer 130. The metal oxide layer 125 may include an oxide containing the same metal as the metal included in the lower electrode 120. For example, the metal oxide layer 125 may include tungsten (W), cobalt (Co), nickel (Ni), iron (Fe), titanium (Ti), molybdenum (Mo), chromium (Cr), zirconium (Zr), hafnium (Hf), niobium (Nb), tantalum (Ta), silver (Ag), gold (Au), aluminum (Al), copper (Cu), tin (Sn), vanadium (V), ruthenium (Ru), platinum (Pt), zinc (Zn), magnesium (Mg), or any combination thereof.

Figure 2:
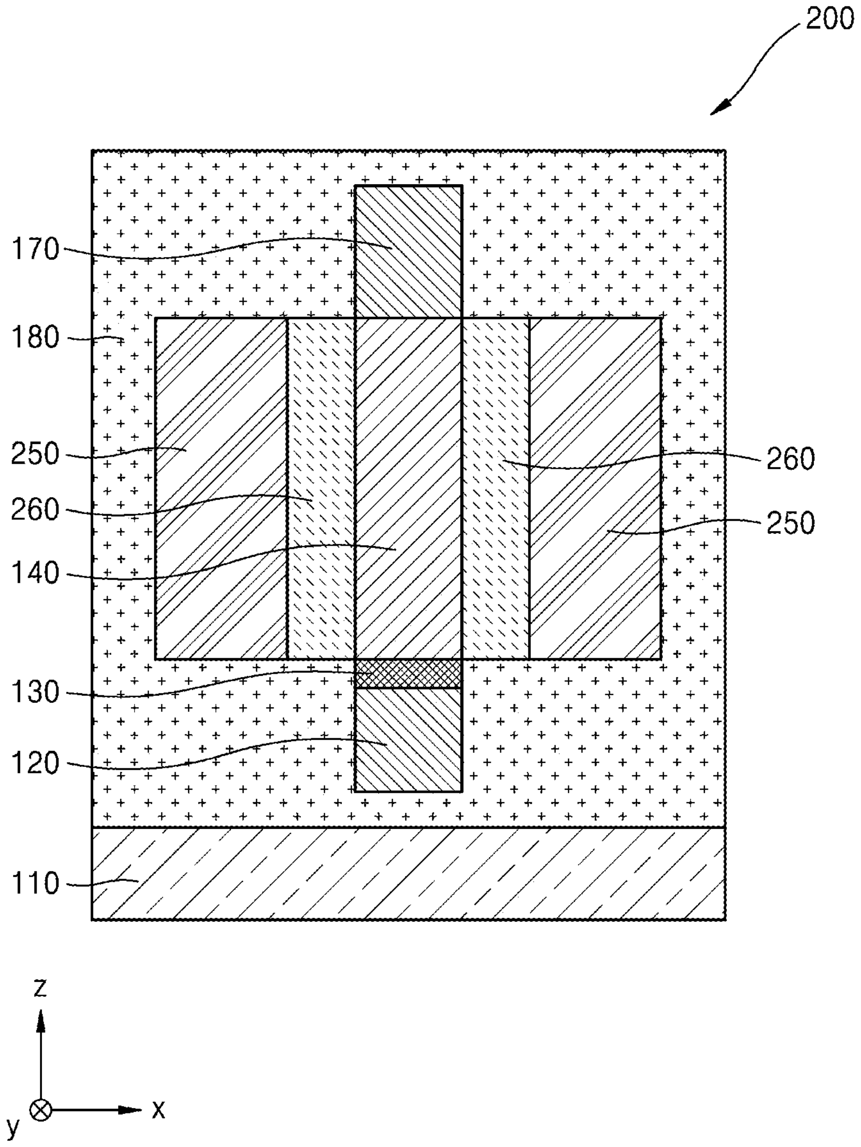
FIG. 2 illustrates a semiconductor device according to some example embodiments.

FIG. 2 illustrates a semiconductor device 200 according to some example embodiments. Components for which the same reference numerals are used as those in FIG. 1A in FIG. 2 have substantially the same configuration and operating effects as those described in FIG. 1A, and thus detailed descriptions thereof are omitted here.

The semiconductor device 200 includes the lower electrode 120, the buffer layer 130, the oxide semiconductor layer 140, and the upper electrode 170 arranged in the direction perpendicular to the substrate 110 (Z-direction). A gate insulating layer 260 may be provided around the oxide semiconductor layer 140 (e.g., may partially or completely surround the oxide semiconductor layer 140 in the X-direction and/or the Y-direction, in an X-Y plane extending in the X and Y directions, or the like), and a gate electrode 250 may be provided around the gate insulating layer 260 (e.g., may partially or completely surround the gate insulating layer 260 in the X-direction and/or the Y-direction, in an X-Y plane extending in the X and Y directions, or the like). The gate electrode 250 may be provided around the oxide semiconductor layer 140 to increase an area where the gate electrode 250 and the oxide semiconductor layer 140 face each other (e.g., increase a surface area of the gate electrode 250 facing an opposing surface of the oxide semiconductor layer 140), and reduce a short channel effect, for example configure the semiconductor device 200 to have reduced short channel effect due to the increased area where the gate electrode 250 and the oxide semiconductor layer 140 face each other.

Figure 3:
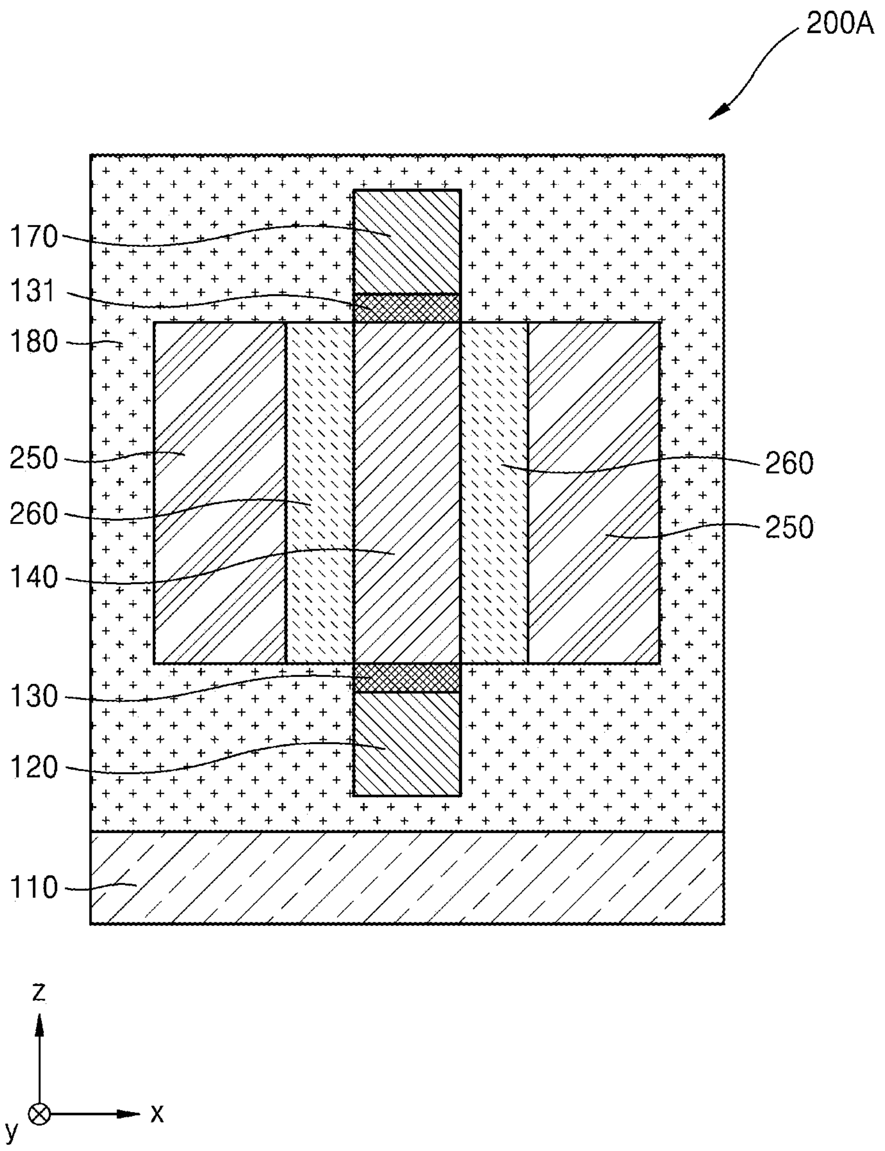
FIG. 3 illustrates an example in which a buffer layer is further included between an oxide semiconductor layer and an upper electrode of the semiconductor device illustrated in FIG. 2 according to some example embodiments.

FIG. 3 illustrates a semiconductor device 200A according to some example embodiments. In FIG. 3, components, for which the same reference numerals as those in FIG. 2 are used, have the same configuration and operating effect as those in FIG. 2, and detailed descriptions thereof are omitted.

Compared to FIG. 2, in FIG. 3, a second buffer layer 131 may be further included between the oxide semiconductor layer 140 and the upper electrode 170. The second buffer layer 131 may include indium. The second buffer layer 131 may include, for example, at least one of InGaZnO, InGaO, InSnO, InZnO, and InO.

Figure 4:
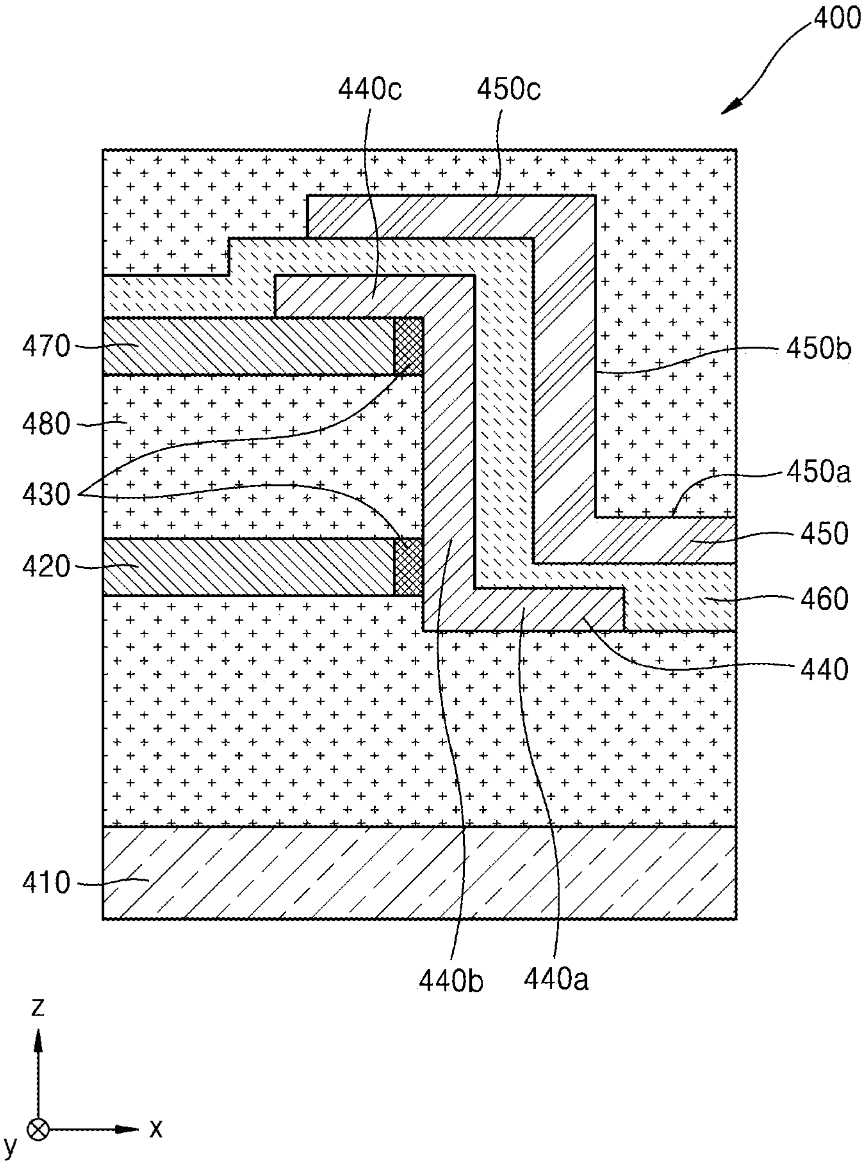
FIG. 4 illustrates a semiconductor device according to some example embodiments.

FIG. 4 illustrates a semiconductor device 400 according to some example embodiments.

The semiconductor device 400 may include a substrate 410, a lower electrode 420 provided on the substrate 410, and an upper electrode 470 arranged apart from the lower electrode 420. The lower electrode 420 and the upper electrode 470 may be arranged apart from each other in a direction perpendicular to the substrate 410 (Z-direction). As shown, an oxide semiconductor layer 440 may be arranged in an outer portion between the lower electrode 420 and the upper electrode 470. For example, as shown in FIG. 4, the oxide semiconductor layer 440 may include at least a portion (e.g., the second portion 440*b*) that is offset from the lower electrode 420 and the upper electrode 470 in the horizontal direction (X-direction) and extends in the perpendicular direction (Z-direction) between at least a position that overlaps the lower electrode 420 in the horizontal direction (X-direction) and another position that overlaps the upper electrode 470 in the horizontal direction (X-direction). The oxide semiconductor layer 440 may include a first portion 440*a* that is parallel to the substrate 410 (e.g., extends in the horizontal direction (X-direction)), a second portion 440*b* that is bent and extended from the first portion 440*a* in a direction perpendicular to the substrate 410 (e.g., extends in the perpendicular direction (Z-direction)), and a third portion 440*c* that is bent and extends from the second portion 440*b* in a direction opposite to the first portion 440*a* (e.g., extends in the negative horizontal direction (−X-direction)). The second portion 440*b* may be arranged to be at the side of the lower electrode 420 and the upper electrode 470, and the third portion 440*c* may be arranged to be in contact (referred to interchangeably herein as direct contact) with the upper electrode 470. A buffer layer 430 may be provided between the lower electrode 420 and the second portion 440*b* of the oxide semiconductor layer 440 and between the upper electrode 470 and the second portion 440*b* of the oxide semiconductor layer 440. A length direction of the second portion 440*b* (Z-direction) may be arranged in the direction perpendicular to the substrate 410 (Z-direction).

A gate electrode 450 may have a similar shape to that of the oxide semiconductor layer 440 and be arranged apart from the oxide semiconductor layer 440. In other words, the gate electrode 450 may include a first portion 450*a* that is parallel to the substrate 410, a second portion 450*b* that is bent and extended from the first portion 450*a* in the direction perpendicular to the substrate 410, and a third portion 450*c* that is bent and extends from the second portion 450*b* in a direction opposite to the first portion 450*a*. A gate insulating layer 460 may be provided between the oxide semiconductor layer 440 and the gate electrode 450.

The buffer layer 430 is substantially the same as the buffer layer 130 described with reference to FIG. 1A, and thus description thereof will be omitted.

Figure 5:
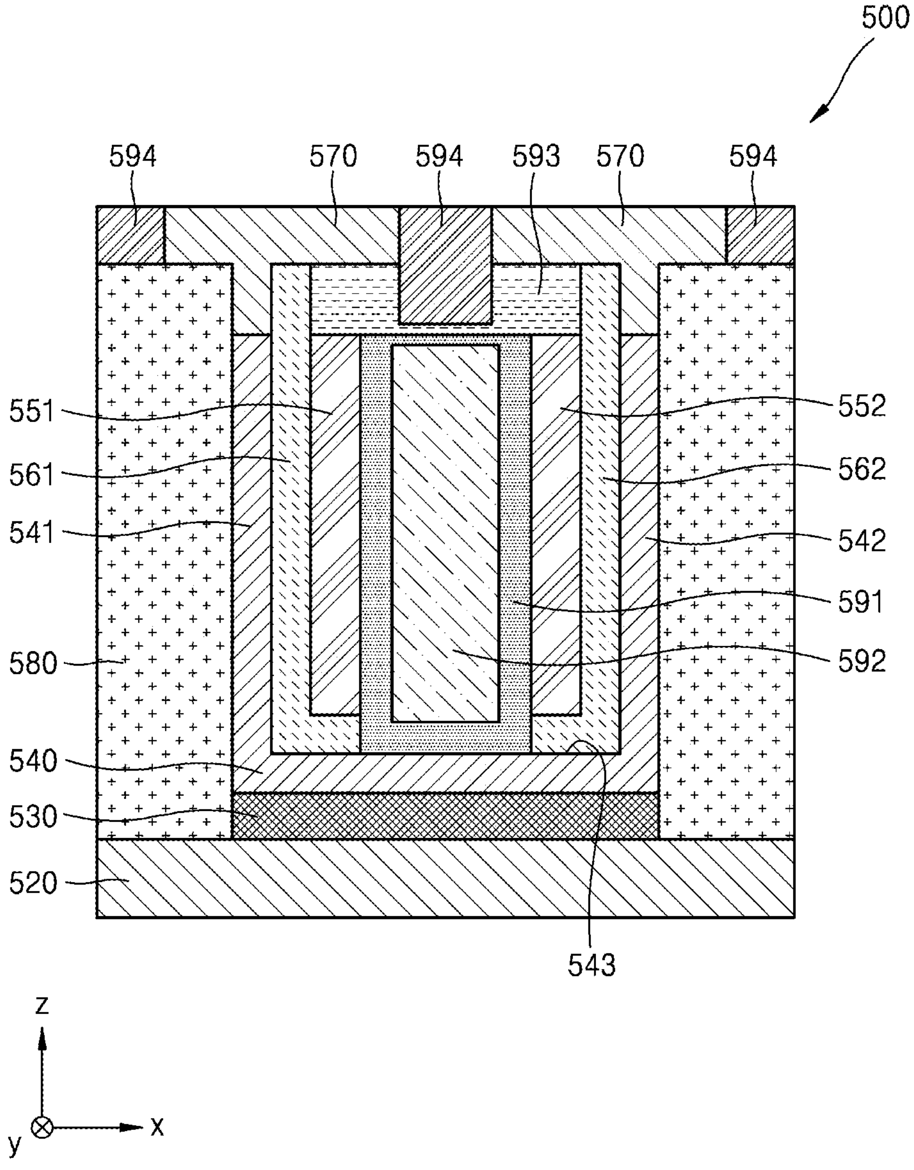
FIG. 5 illustrates a semiconductor device according to some example embodiments.

FIG. 5 illustrates a semiconductor device 500 according to some example embodiments.

The semiconductor device 500 may include a lower electrode 520, a buffer layer 530 provided on the lower electrode 520, and an oxide semiconductor layer 540 provided on the buffer layer 530.

The oxide semiconductor layer 540 may have a U-shaped cross-section. The oxide semiconductor layer 540 may include a bottom portion 543 in contact with the buffer layer 530, a first vertical extension portion 541 extending from one end of the bottom portion 543 in a direction perpendicular to the lower electrode 520 (Z-direction), and a second vertical extension portion 542 extending from the other end of the bottom portion 543 in the direction (Z-direction) perpendicular to the lower electrode 520.

The first gate electrode 551 may be arranged apart from the first vertical extension portion 541, and the second gate electrode 552 may be arranged apart from the second vertical extension portion 542. A first gate insulating layer 561 may be provided between the first vertical extension portion 541 and the first gate electrode 551, and a second gate insulating layer 562 may be provided between the second vertical extension portion 542 and the second gate electrode 552.

The first gate electrode 551 and/or the second gate electrode 552 may extend in a second horizontal direction (y). The first gate electrode 551 and the second gate electrode 552 may be apart (e.g., spaced apart) from each other. The first gate electrode 551 and/or the second gate electrode 552 may form a word line WL. An electrical signal input to the first gate electrode 551 may not match an electrical signal input to the second gate electrode 552. The first gate electrode 551 may control a channel of the first vertical extension portion 541, and the second gate electrode 552 may control a channel of the second vertical extension portion 542.

An insulating liner 591 may be arranged between the first gate electrode 551 and the second gate electrode 552 spaced apart from each other. The insulating liner 591 may be conformally arranged on opposite sidewalls of the first gate electrode 551 and the second gate electrode 552 and/or on an upper surface of the oxide semiconductor layer 540. The insulating liner 591 may have an upper surface that is arranged on the same plane as the first gate electrode 551 and the second gate electrode 552. The insulating liner 591 may include, for example, silicon nitride. A buried insulating layer 592 may fill a space between the first gate electrode 551 and the second gate electrode 552 spaced apart from each other on the insulating liner 591. The buried insulating layer 592 may include, for example, silicon oxide. An upper insulating layer 593 may be arranged on upper surfaces of the first gate electrode 551, the second gate electrode 552, and/or the buried insulating layer 592. An upper surface of the upper insulating layer 593 may be at the same level as an upper surface of a mold insulating layer 580.

The upper electrode 570 may be arranged on the oxide semiconductor layer 540. The upper electrode 570 may function as a landing pad. The upper electrode 570 may include a left upper electrode and a right upper electrode. The left upper electrode may be electrically connected to the first vertical extension portion 541. The right upper electrode may be electrically connected to the second vertical extension portion 542. The left upper electrode and the right upper electrode may not be electrically connected to each other (e.g., may be electrically isolated, insulated, etc. from each other). The upper electrode 570 may include an upper portion and a lower portion. The upper portion of the upper electrode 570 may be a portion of the upper electrode 570 arranged at a level higher than the upper surface of the mold insulating layer 580. The lower portion of the upper electrode 570 may be a portion of the upper electrode 570 arranged in an upper electrode recess defined between the mold insulating layer 580 and the upper insulating layer 593. In some example embodiments, the upper portion of the upper electrode 570 may have a first width w1 in a first horizontal direction (x), and the lower portion of the upper electrode 570 may have a second width w2 less than the first width w1, in the first horizontal direction (x). The lower portion of the upper electrode 570 may be arranged in the upper electrode recess, and the upper portion of the upper electrode 570 may have, on the lower portion of the upper electrode 570, a bottom surface arranged on the upper surface of the mold insulating layer 580 and the upper surface of the upper insulating layer 593, and accordingly, the upper electrode 570 may have a T-shaped vertical cross-section. A bottom surface of the lower portion of the upper electrode 570 may contact upper portions of surfaces of the first vertical extension portion 541 and/or the second vertical extension portion 542. Both sidewalls of the lower portion of the upper electrode 570 may be aligned with both sidewalls of the first vertical extension portion 541 and the second vertical extension portion 542. The bottom surface of the lower portion of the upper electrode 570 may be arranged at a higher level than the upper surfaces of the first gate electrode 551 and/or the second gate electrode 552, and a portion of a sidewall of the lower portion of the upper electrode 570 may be covered by the first gate insulating layer 561 and/or the second gate insulating layer 562. An upper electrode insulating layer 594 surrounding the upper electrode 570 may be arranged on upper surfaces of the mold insulating layer 580 and the upper insulating layer 593. The semiconductor device 500 may have a vertical channel transistor (VCT) structure including a vertical channel region extending in a direction (z) perpendicular to the lower electrode 520.

Figure 6:
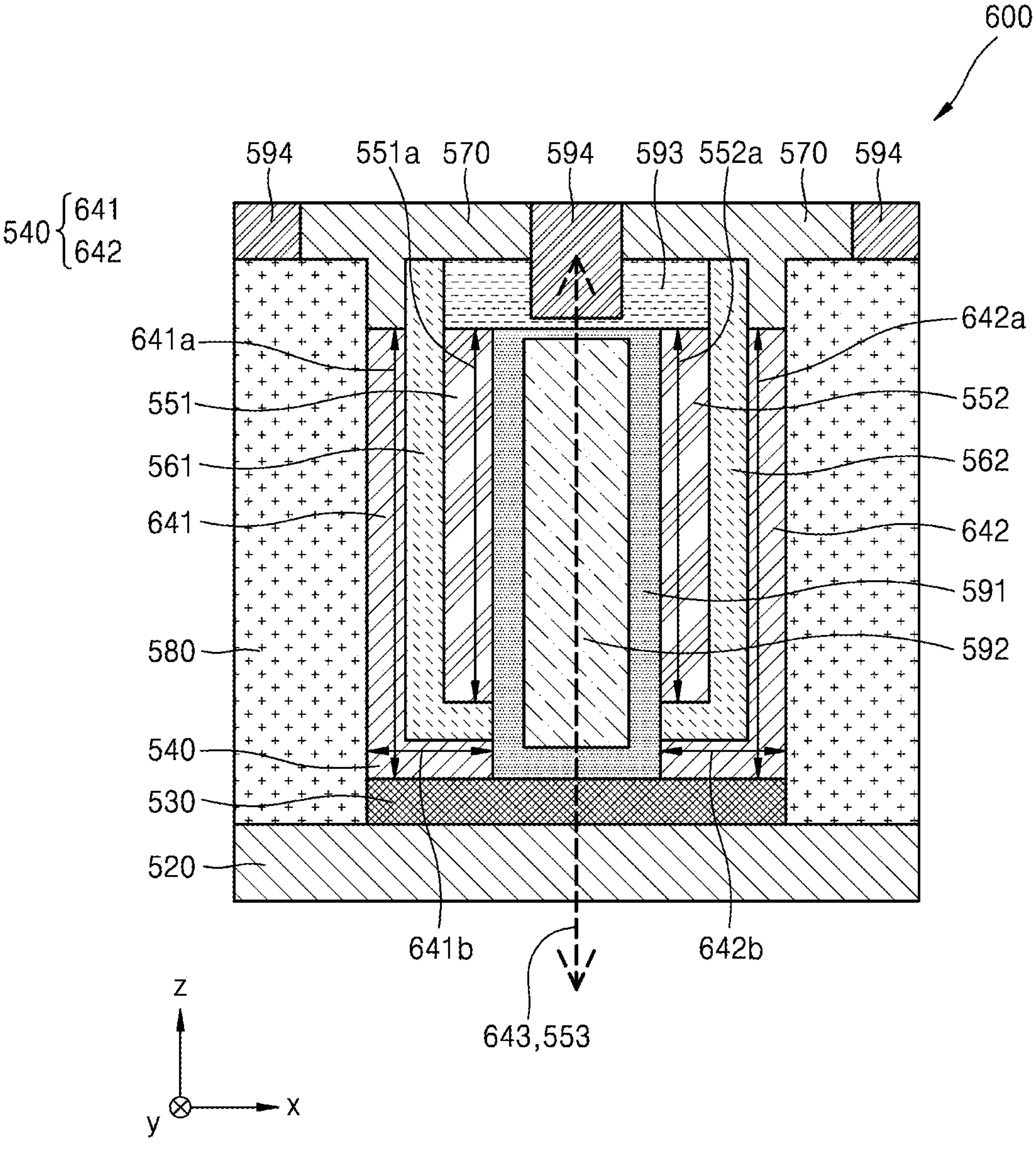
FIG. 6 illustrates an example in which a modified oxide semiconductor layer is included in the semiconductor device illustrated in FIG. 5 according to some example embodiments.

FIG. 6 illustrates a semiconductor device 600 according to some example embodiments.

In FIG. 6, components, for which the same reference numerals as those in FIG. 5 are used, have substantially the same configuration and operating effect as those in FIG. 5, and detailed descriptions thereof are omitted.

Compared to FIG. 5, an oxide semiconductor layer of FIG. 6 may have a different shape. The oxide semiconductor layer may include a first oxide semiconductor layer 641 and a second oxide semiconductor layer 642. The first oxide semiconductor layer 641 may have an L-shaped cross-section, and the second oxide semiconductor layer 642 may have a symmetrical shape with respect to the first oxide semiconductor layer 641 in a Z-direction. The first oxide semiconductor layer 641 may be separated from the second oxide semiconductor layer 642.

The first oxide semiconductor layer 641 and the second oxide semiconductor layer 642 may be each arranged such that a relatively long direction thereof is in a direction perpendicular to a substrate (not shown) (Z-direction). For example, the first and second oxide semiconductor layers 641 and 642 may each have an L-shape and may have respective length dimensions 641*a* and 642*a* and respective width dimensions 641*b* and 642*b* extending perpendicular to each other such that the respective length dimensions 641*a* and 642*a* of the first and second oxide semiconductor layers 641 and 642 each extend in the perpendicular direction (Z-direction). For example, the second oxide semiconductor layer 642 may be symmetrically arranged with respect to the first oxide semiconductor layer 641 with respect to the perpendicular direction (Z-direction) such that the first and second oxide semiconductor layers 641 and 642 have reflection symmetry (e.g., mirror symmetry) around a first axis of symmetry 643 that extends in the perpendicular direction (Z-direction).

As shown in FIG. 6, the first and second gate electrodes 551 and 552 may have respective length dimensions 551*a* and 552*a* that each extend in the perpendicular direction (Z-direction). For example, the second gate electrode 552 may be symmetrically arranged with respect to the first gate electrode 551 with respect to the perpendicular direction (Z-direction) such that the first and second gate electrodes 551 and 552 have reflection symmetry around a second axis of symmetry 553 that extends in the perpendicular direction (Z-direction).

As shown in FIG. 6, the first and second axes of symmetry 643, 553 may be coaxial (e.g., the same axis), but example embodiments are not limited thereto. For example, in some example embodiments the first and second axes of symmetry 643 and 553 may extend paraxial to each other, such that the first and second oxide semiconductor layers 641 and 642 and the first and second gate electrodes 551 and 552 have reflective symmetry around different axes of symmetry.

In some example embodiments, one of the first and second oxide semiconductor layers 641 and 642 or the first and second gate electrodes 551 and 552 may have reflective symmetry, which another one of the first and second oxide semiconductor layers 641 and 642 and the first and second gate electrodes 551 and 552 do not have reflective symmetry. For example, in some example embodiments the first and second oxide semiconductor layers 641 and 642 may have reflective symmetry around the first axis of symmetry 643 while the first and second gate electrodes 551 and 552 are asymmetrically arranged. In another example, in some example embodiments first and second gate electrodes 551 and 552 may have reflective symmetry around the second axis of symmetry 553 while the first and second oxide semiconductor layers 641 and 642 are asymmetrically arranged.

Figure 7:
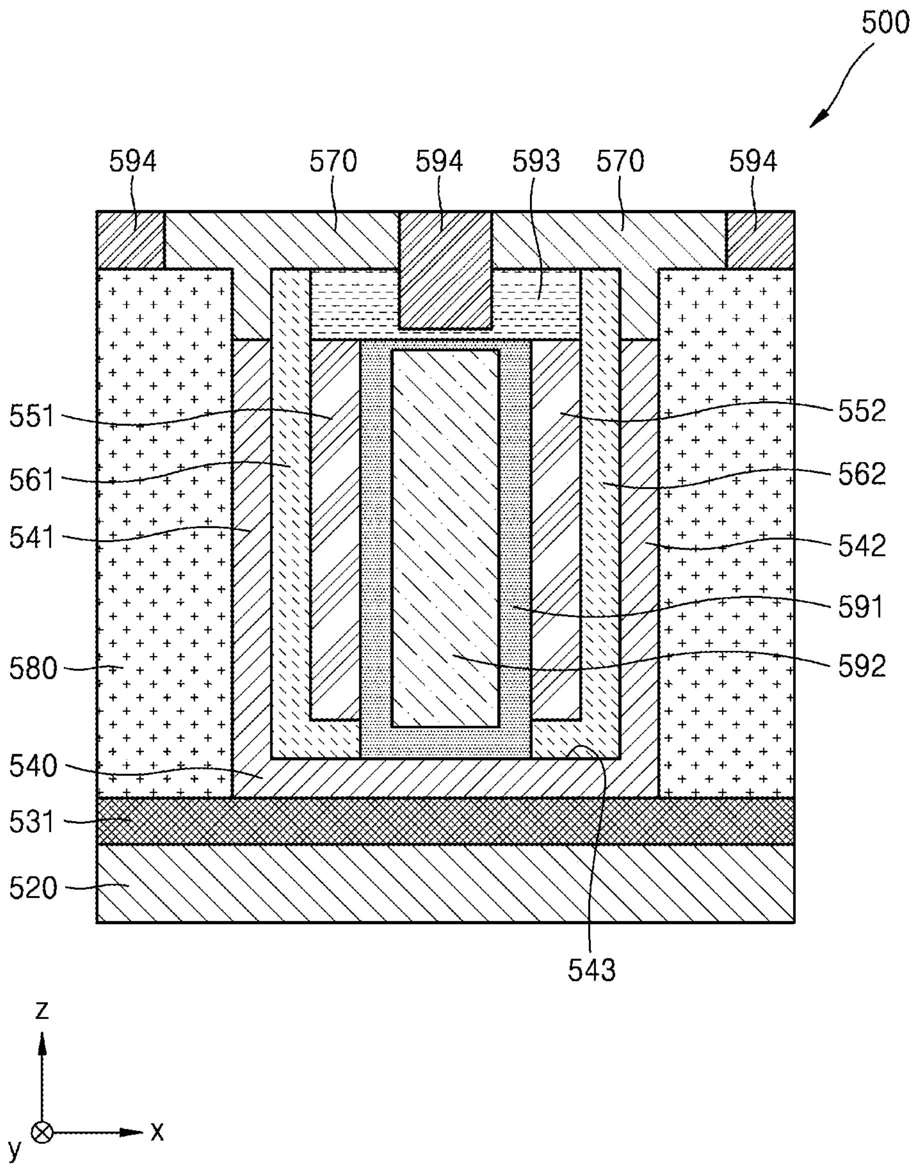
FIG. 7 illustrates an example in which a modified buffer layer is included in the semiconductor device illustrated in FIG. 5 according to some example embodiments.

FIG. 7 illustrates an example in which a buffer layer is modified in the semiconductor device 500 illustrated in FIG. 5.

Compared to FIG. 5, in FIG. 7, a buffer layer 531 may be provided over the entire lower electrode 520. The lower electrode 520 may be formed as a bit line, and the buffer layer 531 may be provided along the lower electrode 520.

Next, operating effects of a semiconductor device according to some example embodiments are described below.

Referring to FIG. 1A, the semiconductor device 100 may be applied to (e.g., included in) a transistor that uses the oxide semiconductor layer 140 as a channel, and in order to increase an In content in a region between the lower electrode 120 and the oxide semiconductor layer 140, initial process conditions may be adjusted, or the overall oxide semiconductor composition may be uniformly maintained at the interface of the lower electrode 120 by using an atomic layer deposition (ALD) process.

For example, W, which is widely used as an electrode material, has high oxidation reactivity, and thus is easily oxidized during the oxidation reaction of the ALD precursor, and at the same time suppresses the In oxidation reaction on an electrode surface, thereby lowering the In composition of an oxide semiconductor. When the composition of In in the oxide semiconductor layer 140 is lowered, device characteristics may deteriorate, for example, current $I_{on}$ may decrease due to a decrease in the amount of carriers.

Thus, the interface composition may be adjusted in some example embodiments in order to suppress a phenomenon in which the composition of a specific material is too low or too high in some regions of a contact area between the oxide semiconductor layer 140 and the lower electrode 120. When forming the buffer layer 130, sufficient reaction of materials that have low reactivity at the interface between the lower electrode 120 and the oxide semiconductor layer 140 may be induced by, for example, increasing a sub-cycle or a source time thereof, thereby allowing the oxide semiconductor layer 140 to have a uniform composition at an interface thereof, thereby enabling improved device characteristics and thus improving performance of the semiconductor device 100, for example due to reducing short-channel effect in the semiconductor device 100 due to improved uniformity of composition of the oxide semiconductor layer 140 at the interface portion thereof (e.g., at the interface of the oxide semiconductor layer 140 with the buffer layer 130).

When forming an oxide semiconductor layer by ALD, by increasing the sub-cycle of a precursor having poor reactivity at the interface where a lower electrode contacts the oxide semiconductor layer, the composition ratio of the interface of the lower electrode may be adjusted to a level similar to that of the inside (e.g., interior) of the oxide semiconductor layer. For example, the initial sub-cycle of an In precursor having relatively low reactivity may be increased from 3 times to 9 times. As such, by increasing the In content by controlling the sub-cycle in the initial growth mode, the composition ratio of In, Ga, and Zn at the lower electrode interface may be uniformly adjusted.

Recently, silicon-based memories or logic devices have reached the limit of high integration, and reducing off-current has become very important as a channel length of several tens or several nanometers may be included in such devices. In addition, improvement in subthreshold swing (SS) and on/off ratio as characteristics required to reinforce a clear distinction between on/off states may be included in such devices. The above-described characteristics of an oxide semiconductor device used as a large-size display driving device are excellent (low off-current, low SS, and high on/off ratio). Thus, recently, an oxide semiconductor device having these advantages has been applied to a memory or logic device. Also, as a low-temperature process at 500° C. or lower is now possible, the degree of integration may be increased by stacking an oxide semiconductor device on a Si-based device.

However, the reason why it is difficult to directly apply a display driving device to a semiconductor-oriented device (e.g., semiconductor device) is that performance is degraded due to the presence of a short-channel effect due to scaling-down (e.g., miniaturization of semiconductor-oriented devices). For example, Vth control becomes difficult as the size (width and length) and the thickness of a channel layer decrease, and a reduction in a contact area where the channel layer meets source/drain may lead to an increase in contact resistance. In particular, when ALD technology is applied to apply (e.g., form) an oxide semiconductor to a channel length of several nanometers, the reaction energy of a precursor on a surface of a lower electrode may vary according to the type of a metal material of the lower electrode, and the composition of an oxide semiconductor layer at the initial growth stage may vary. For example, when an InGaZnO oxide semiconductor layer is formed on a W electrode by ALD, Zn decomposition is first induced at an interface between the W electrode and the InGaZnO oxide semiconductor layer, and decomposition of In is suppressed, and accordingly, the content of In may be relatively low at the interface. When the content of In in the oxide semiconductor layer is lowered, the overall device characteristics are deteriorated, and thus, control of the interface composition is important.

Figure 8:
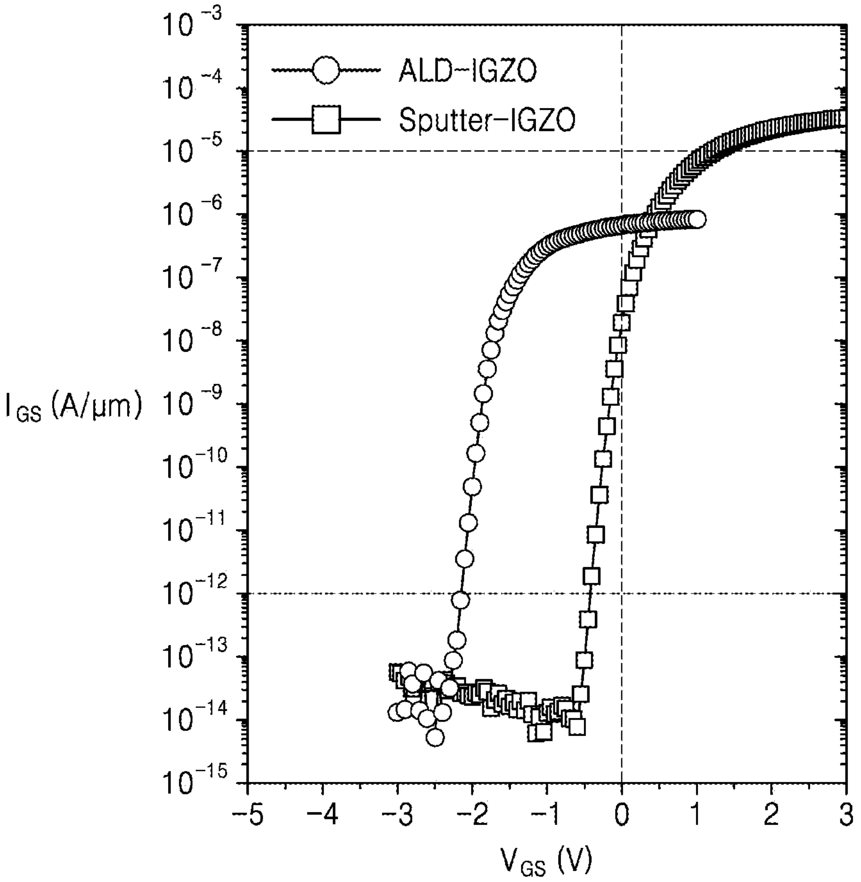
FIG. 8 is a graph showing voltage-current characteristics of a semiconductor device, according to a deposition method of an oxide semiconductor layer deposited on an electrode according to some example embodiments.

FIG. 8 is a graph showing device characteristics according to a deposition method of an oxide semiconductor layer in an oxide semiconductor transistor in which the oxide semiconductor layer is deposited on an electrode.

Referring to FIG. 8, when the oxide semiconductor layer is deposited on the electrode by the ALD method, device characteristics, for example, drain current (IDs) may be deteriorated relatively significantly compared to when the oxide semiconductor layer is deposited by a sputtering method.

Table 1 below shows a comparison between a case where the oxide semiconductor layer is deposited by a sputtering method and a case where the oxide semiconductor layer is deposited by the ALD method.

TABLE 1

| process method | source/ drain electrode | gate insulating layer | $V_{th,\,sat}$ $V_{th,\,sat}$ (V) | Ion($^{\mu A/\mu m}$ μA/μm) | SS (mV/ dec) |
|---|---|---|---|---|---|
| Sputter-IGZO | W electrode: 20 nm | HfO | −0.24 | 3.372 | 90 |
| ALD-IGZO | etching #6 20 seconds | 10 nm | −1.94 | 0.333 | 95 |

Referring to Table 1 above, when deposited by a sputtering method, compared to the case of deposited by the ALD method, the saturation threshold voltage ($V_{th,sat}$), the $I_{on}$ value are decreased, and the subthreshold swing (SS) value is increased.

Figure 9:
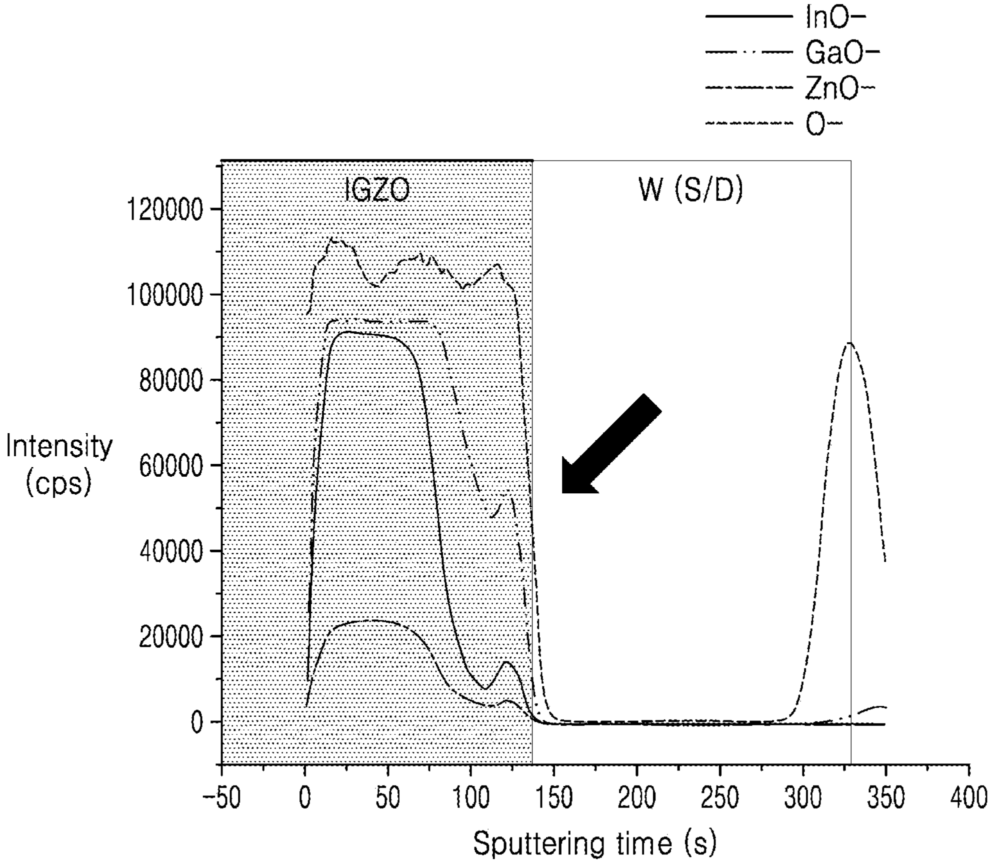
FIG. 9 is a graph showing a secondary-ion mass spectrometry (SIMS) analysis result for an interface between an electrode and an oxide semiconductor layer when the oxide semiconductor layer is deposited on the electrode by an atomic layer deposition (ALD) method according to some example embodiments.

FIG. 9 is a graph showing a secondary-ion mass spectrometry (SIMS) analysis result for an interface of an oxide semiconductor layer when the oxide semiconductor layer is deposited on an electrode by using an ALD method.

Figure 10:
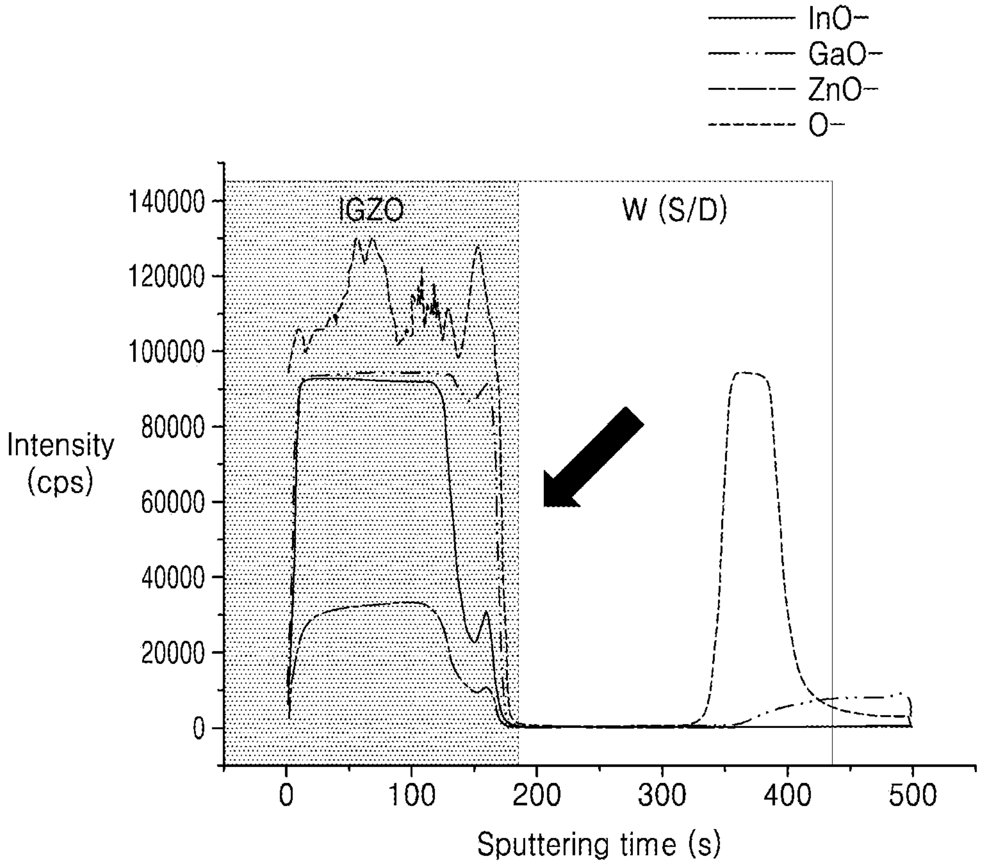
FIG. 10 is a graph showing an SIMS analysis result for an interface between an electrode and an oxide semiconductor layer when the oxide semiconductor layer is deposited on the electrode using a sputtering method according to some example embodiments.

FIG. 10 is a graph showing an SIMS analysis result for an interface of an oxide semiconductor layer when the oxide semiconductor layer is deposited on an electrode by using a sputtering method.

Referring to FIGS. 9 and 10 together, compared to an oxide semiconductor transistor deposited by a sputtering method, in the case of an oxide semiconductor transistor deposited by the ALD method, an interface composition of the oxide semiconductor layer is relatively non-uniformly distributed. When the oxide semiconductor layer is deposited on the electrode by the ALD method, a relatively small In composition and a relatively large Zn composition may be induced at the interface of the oxide semiconductor layer.

In the oxide semiconductor transistor deposited without a buffer layer by the ALD method, the In composition is relatively small and the Zn composition is relatively large at the interface of the oxide semiconductor layer (e.g., interface with an electrode, a buffer layer, etc.). When the In content is relatively small at the interface of the oxide semiconductor layer, the interface resistance may be high and thus a current value may be low. Accordingly, as the semiconductor device according to some example embodiments includes an In-containing buffer layer between the lower electrode and the oxide semiconductor layer, the contact resistance between the lower electrode and the oxide semiconductor layer may be reduced, and the decrease in the In content of the oxide semiconductor layer may be reduced, thereby improving the electrical characteristics of the semiconductor device. When depositing an oxide semiconductor on an indium-containing buffer layer by using the ALD method, the In composition may relatively increase and the Zn composition may relatively decrease at the interface of the oxide semiconductor layer, compared to when depositing an oxide semiconductor without a buffer layer. Thus, the contact resistance of the oxide semiconductor transistor may be reduced and the electrical characteristics may be improved. Additionally, according to the semiconductor device according to an embodiment, diffusion of Zn in the oxide semiconductor layer to the lower electrode may be suppressed by using the buffer layer. Accordingly, the Zn content may be distributed in a very small amount or Zn may not exist in the lower electrode. For example, the lower electrode may include Zn with a content of 10 at % or less. In the buffer layer, the Zn content may be less than the In content. SIMS or energy dispersive spectroscopy (EDS) method may be used as an elemental amount measurement method.

Figure 11:
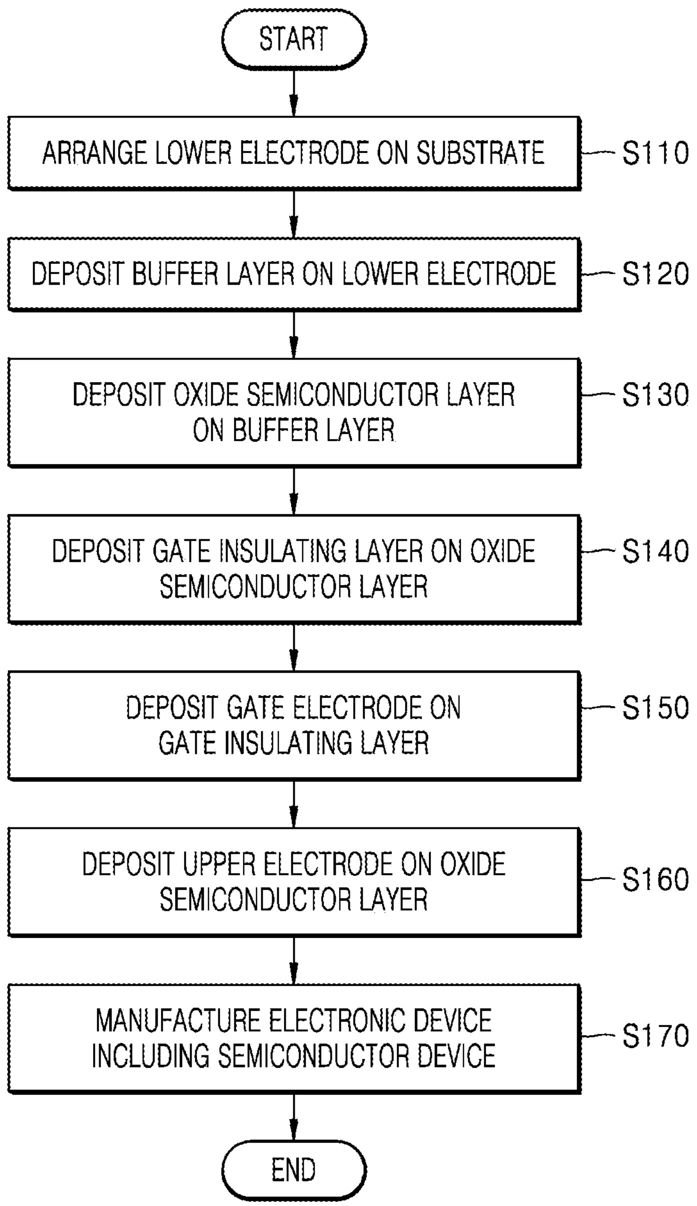
FIG. 11 is a flowchart of a method of manufacturing a semiconductor device, according to some example embodiments.

FIG. 11 is a flowchart of a method of manufacturing a semiconductor device, according to some example embodiments. Hereinafter, a method of manufacturing a semiconductor device will be described with reference to FIGS. 1A and 11.

The lower electrode 120 may be arranged on the substrate 110 in operation S110, and the buffer layer 130 may be deposited on the lower electrode 120 in operation S120. The buffer layer 130 may be deposited using, for example, a selective ALD process, the ALD process, a plasma-enhanced atomic layer deposition (PE-ALD) process. Then, the oxide semiconductor layer 140 may be deposited on the buffer layer 130 in operation S130. The depositing of the oxide semiconductor layer 140 may include the ALD process or the PE-ALD process. The gate insulating layer 160 may be deposited on the oxide semiconductor layer 140 in operation S140, and the gate electrode 150 may be deposited on the gate insulating layer 160 in S150. Then, the upper electrode 170 may be deposited on the oxide semiconductor layer 140 in operation S160. The semiconductor device manufactured based at least in part upon operations S110 to S160 may be incorporated (e.g., applied) into an assembly electronic device to at least partially manufacture an electronic device including the semiconductor device in operation S170.

Figure 12:
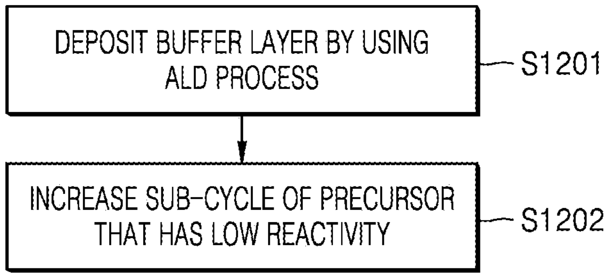
FIG. 12 illustrates an example of a method of forming a buffer layer in a method of manufacturing a semiconductor device, according to some example embodiments.

Referring to FIG. 12, the depositing of the buffer layer 130 on the lower electrode 120 (S120) may include the ALD process (S1201). The ALD process may be performed by a difference in an initial crystal nucleation rate of a thin film according to chemical species selectively exposed on a surface of the lower electrode 120 during ALD. A buffer layer having a high In content may be selectively deposited only on an electrode by applying a precursor that is highly reactive to an electrode material, to the lower electrode 120. Conversely, the buffer layer 130 may be deposited by increasing a sub-cycle of initial thin film deposition of an indium precursor that has low reactivity to an electrode material applied to the lower electrode 120 (S1202), thereby increasing the In content of the buffer layer 130. The type of precursor may include a material such as 3-dimethylamino-propyl)dimethylindium (DADI) containing In, which does not have high surface reactivity to metals such as W, Pt, and Au, and thus the In content thereof tends to drop rapidly at the interface. Thus, unlike the ALD process on a Si substrate, the sub-cycle of the In precursor may be increased on a metal electrode. For example, when sub-cycles ratio of In, Ga, and Zn precursors at the beginning of forming an oxide semiconductor on a metal electrode is 9:2:1, a sufficient amount of In may be included, and after deposition of a buffer layer is completed, a sufficient amount of In may be included in an oxide semiconductor layer with a sub-cycle ratio of 3:2:1. In some example embodiments, process conditions may be adjusted such that the buffer layer 130, which reduces contact resistance, and the oxide semiconductor layer 140 are simultaneously deposited on the lower electrode 120, or the surface of the lower electrode 120 may be treated with an inhibitor or an initiator.

Next, a method of manufacturing a semiconductor device according to some example embodiments is described with reference to FIGS. 13 to 26.

FIGS. 13, 14, 15, 16, 17, 18, 19, 20, 21, 22, 23, 24, 25, and 26, are diagrams for describing a method of manufacturing a semiconductor device, according to some example embodiments.

Figure 13:
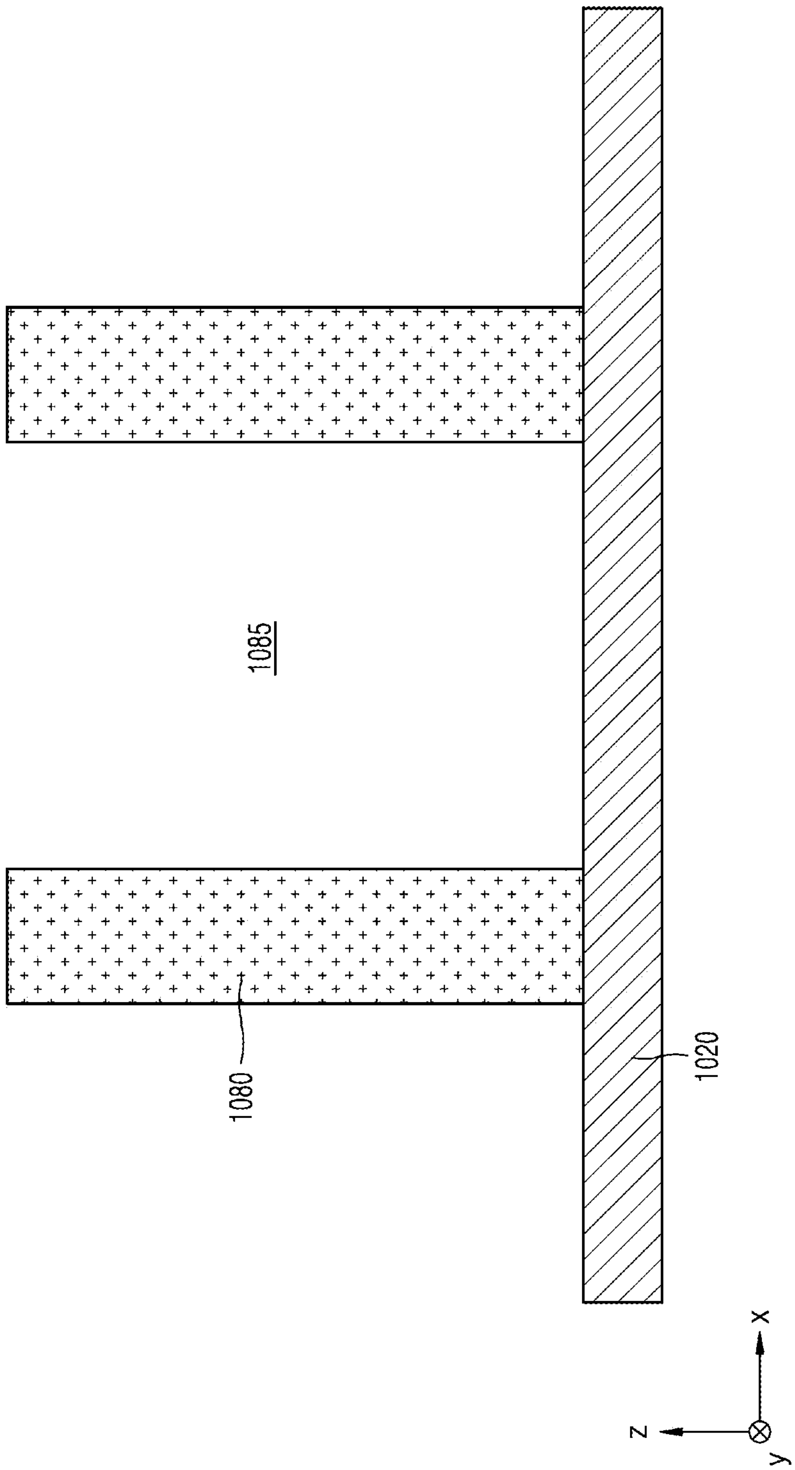
FIGS. 13, 14, 15, 16, 17, 18, 19, 20, 21, 22, 23, 24, 25, and 26 are diagrams for describing a method of manufacturing a semiconductor device, according to some example embodiments.

Referring to FIG. 13, a plurality of mold insulating layers 1080 extending in a second horizontal direction (y) may be deposited on a lower electrode 1020 extending in a first horizontal direction (x). The mold insulating layers 1080 may be stacked until they have a certain height along a vertical direction (z). The plurality of mold insulating layers 1080 and the lower electrode 1020 may form an opening 1085.

Figure 14:
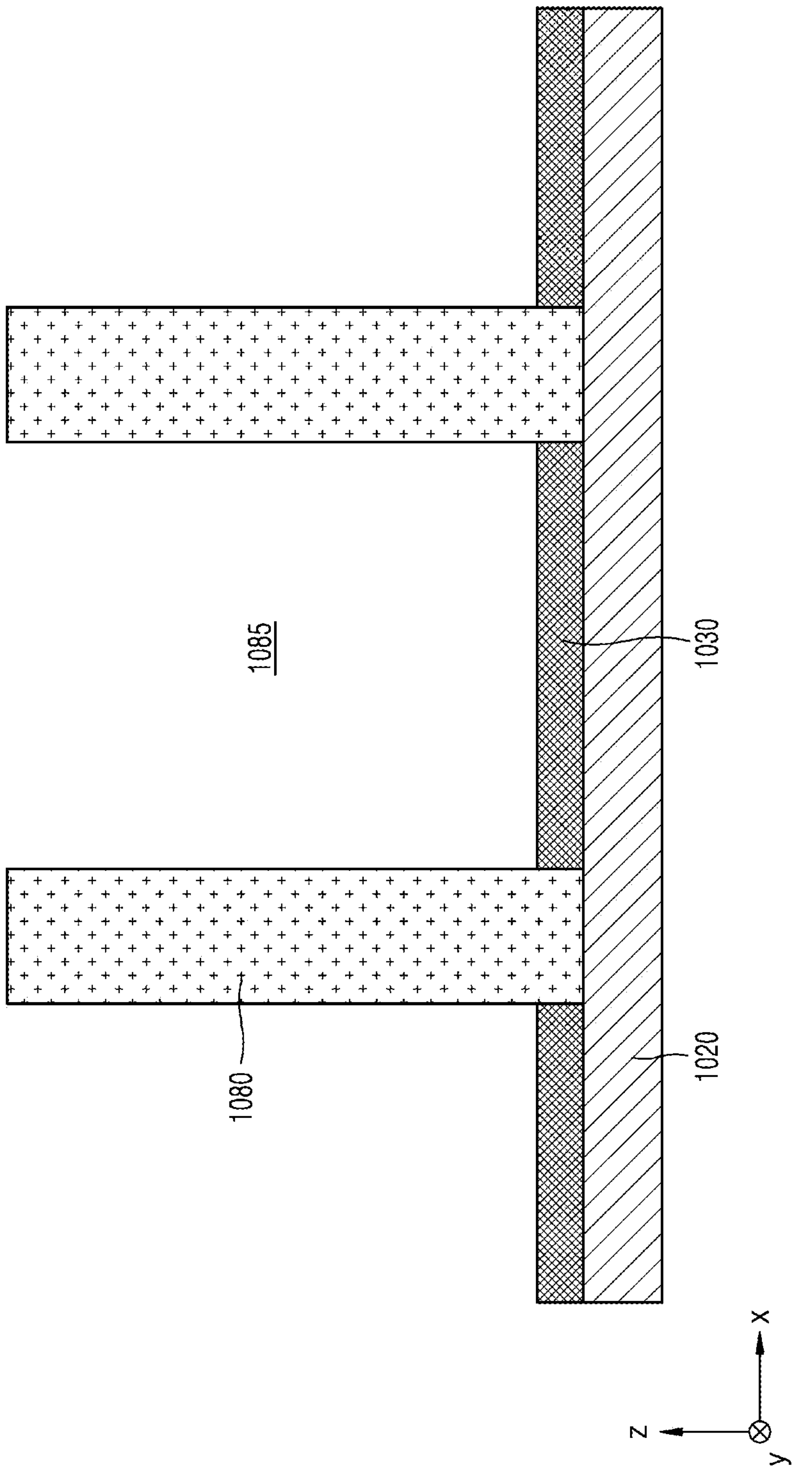

Referring to FIG. 14, a buffer layer 1030 may be deposited on the lower electrode 1020. The buffer layer 1030 may include an oxide containing first indium. The buffer layer 1030 may be deposited using the ALD process. The buffer layer 1030 may have a thickness from about 1 Å to about 50 Å.

Figure 15:
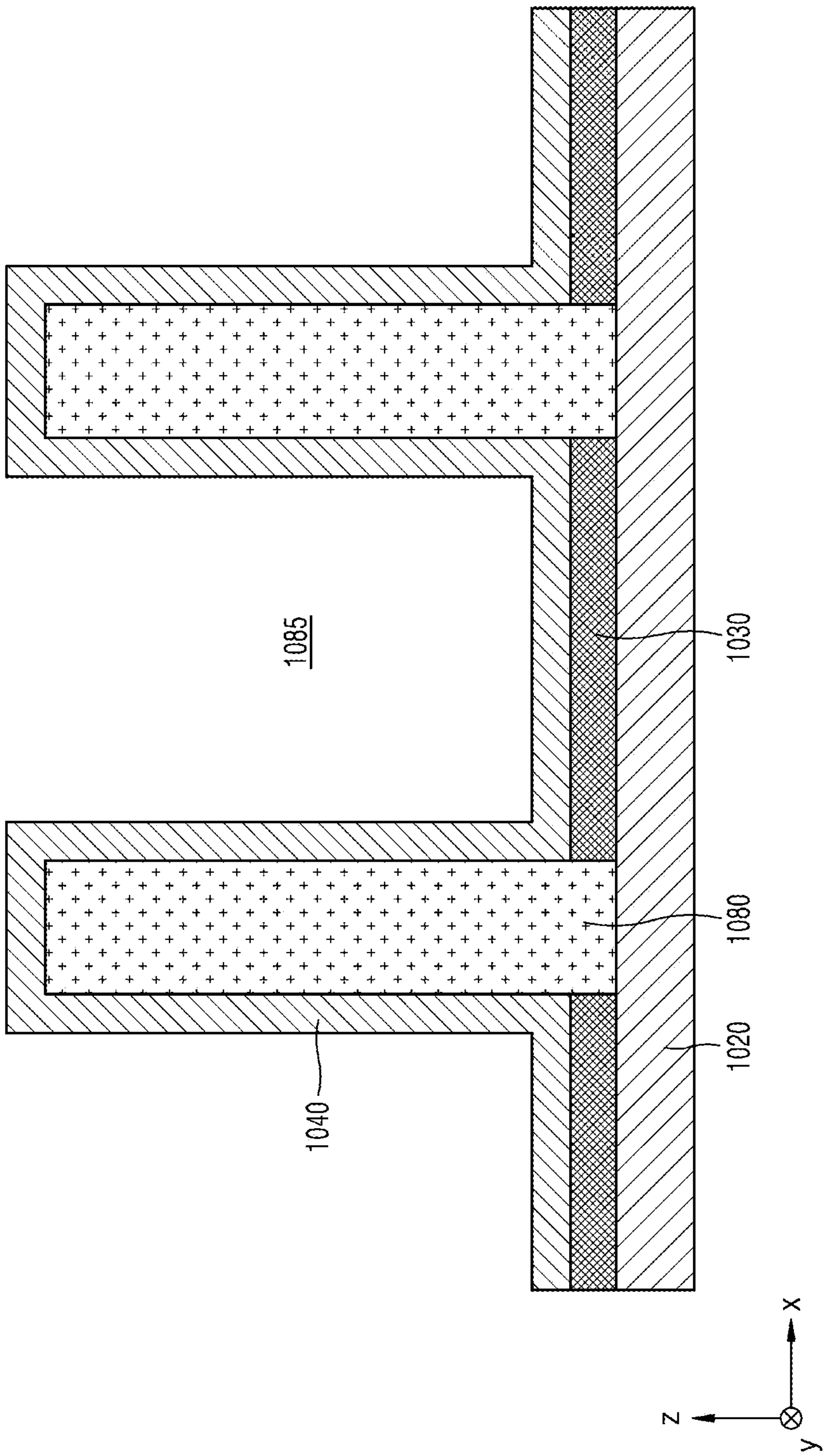
Figure 16:
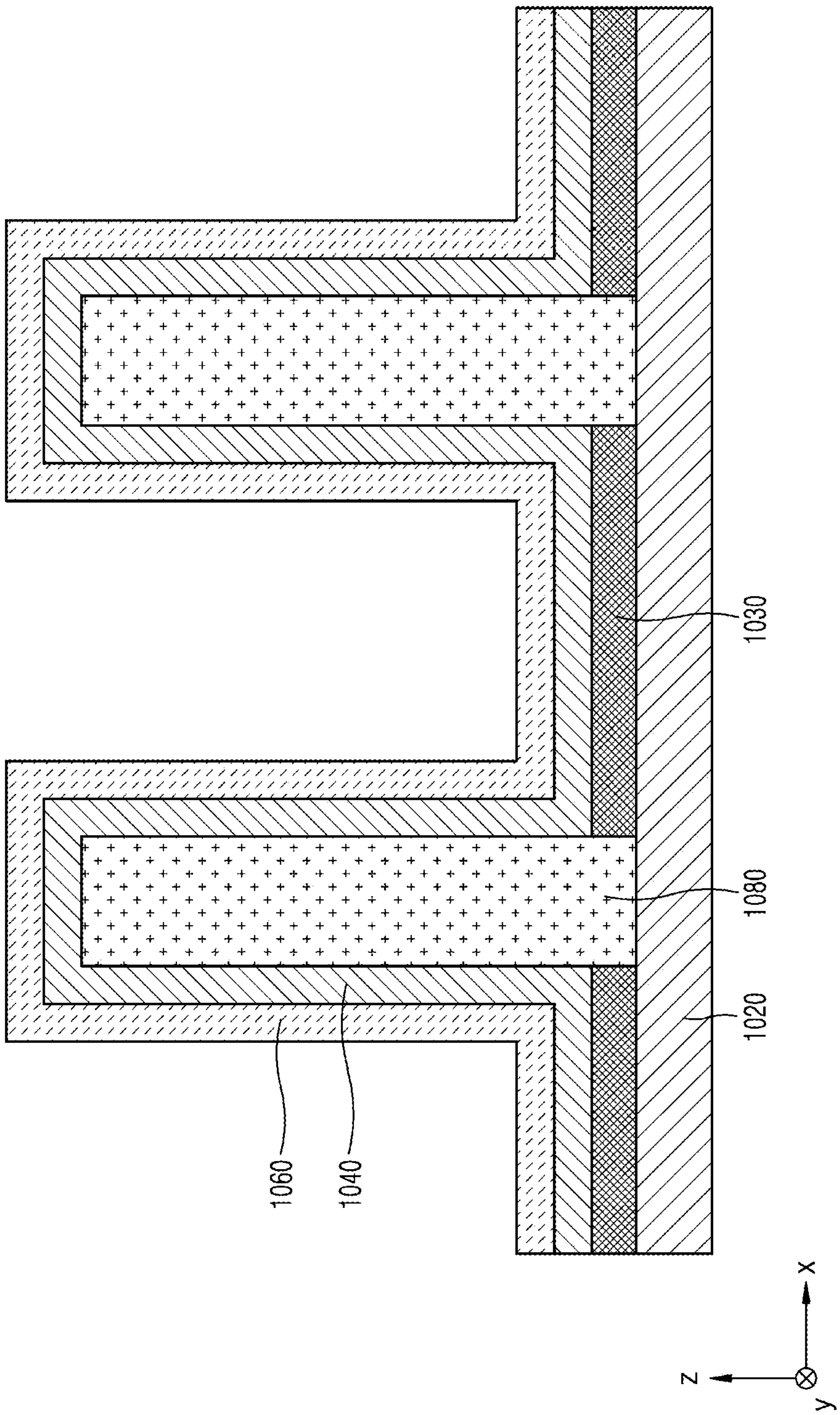
Figure 17:
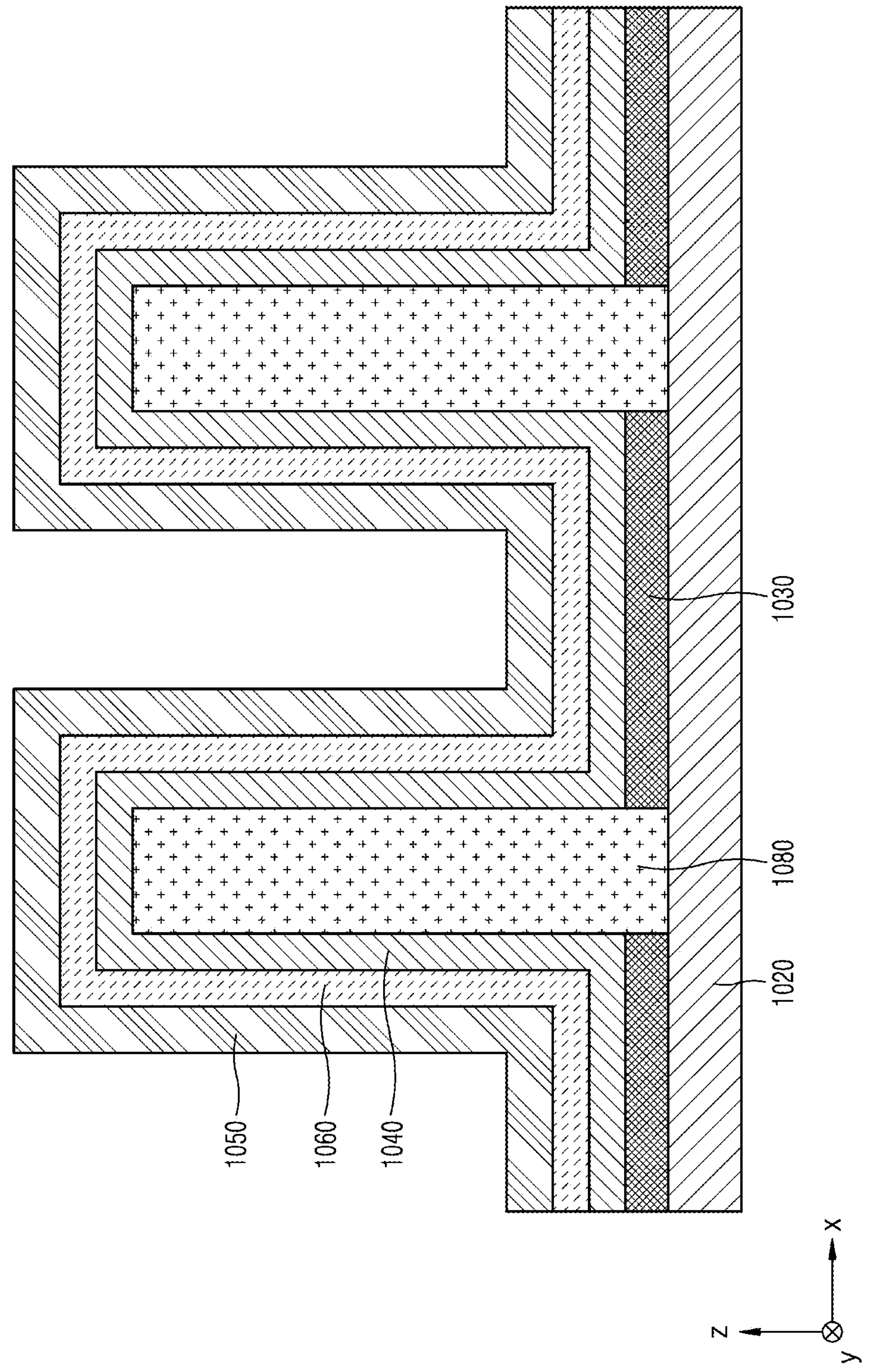

Referring to FIG. 15, an oxide semiconductor layer 1040 may be deposited on the buffer layer 1030 and the mold insulating layers 1080. The oxide semiconductor layer 1040 may be deposited using the ALD method. The oxide semiconductor layer 1040 may have a U-shaped cross-section. Referring to FIG. 16, a gate insulating layer 1060 may be deposited on the oxide semiconductor layer 1040. Referring to FIG. 17, a gate electrode 1050 may be deposited on the gate insulating layer 1060.

Figure 18:
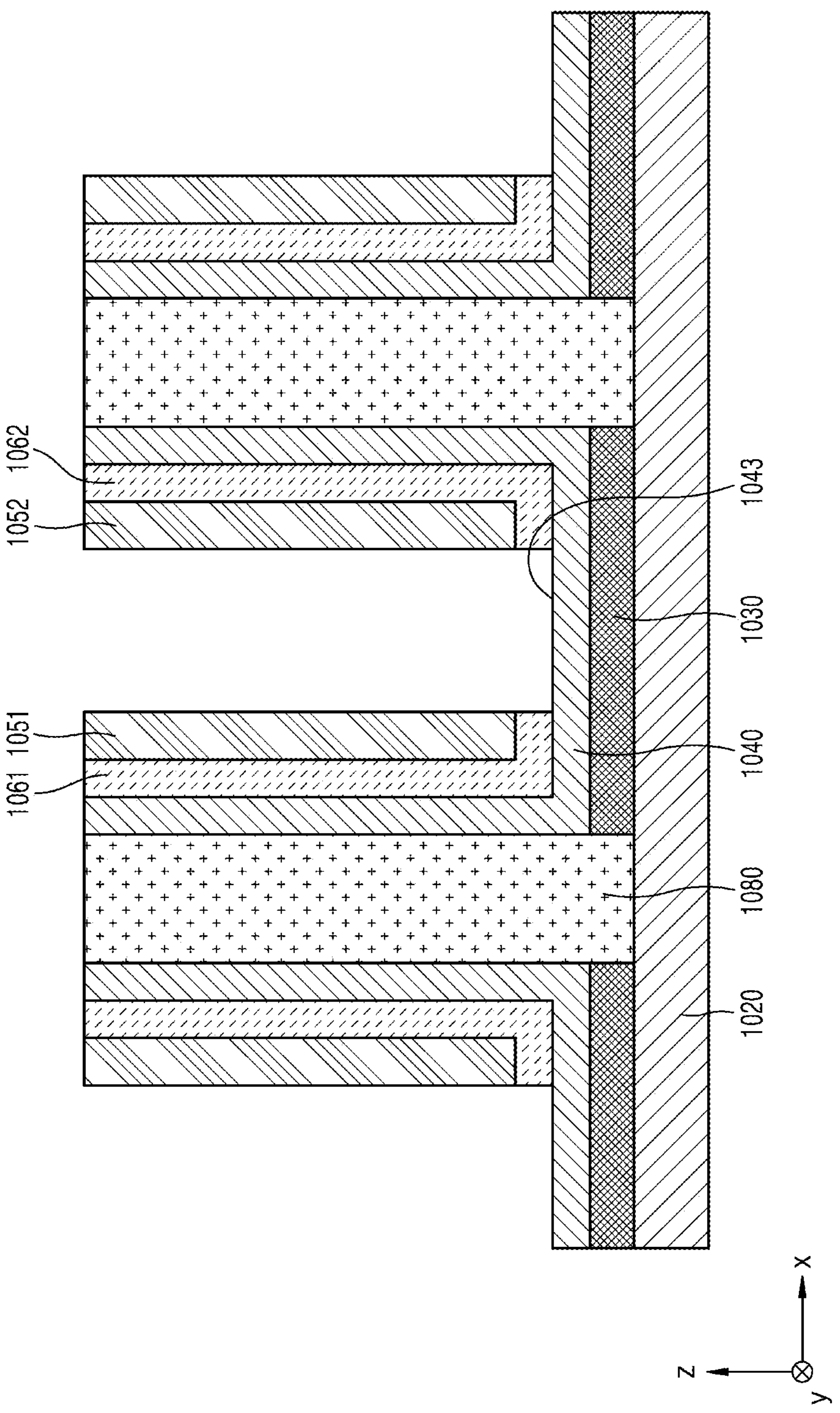

Referring to FIG. 18, anisotropic etching may be performed on the gate electrode 1050 of the structure illustrated in FIG. 17 to expose a bottom portion 1043 of the oxide semiconductor layer 1040. Accordingly, the gate electrode 1050 may be separated into a first gate electrode 1051 and a second gate electrode 1052, and the gate insulating layer 1060 may be separated into a first gate insulating layer 1061 and a second gate insulating layer 1062. In addition, upper surfaces of the mold insulating layers 1080 may be exposed as the gate electrode 1050, the gate insulating layer 1060, and the oxide semiconductor layer 1040 are etched in an upper direction of the mold insulating layers 1080. Levels of the upper surfaces of the mold insulating layers 1080, upper surfaces of the first gate electrode 1051 and the second gate electrode 1052, and upper surfaces of the first gate insulating layer 1061 and the second gate insulating layer 1062 may match one another.

Figure 19:
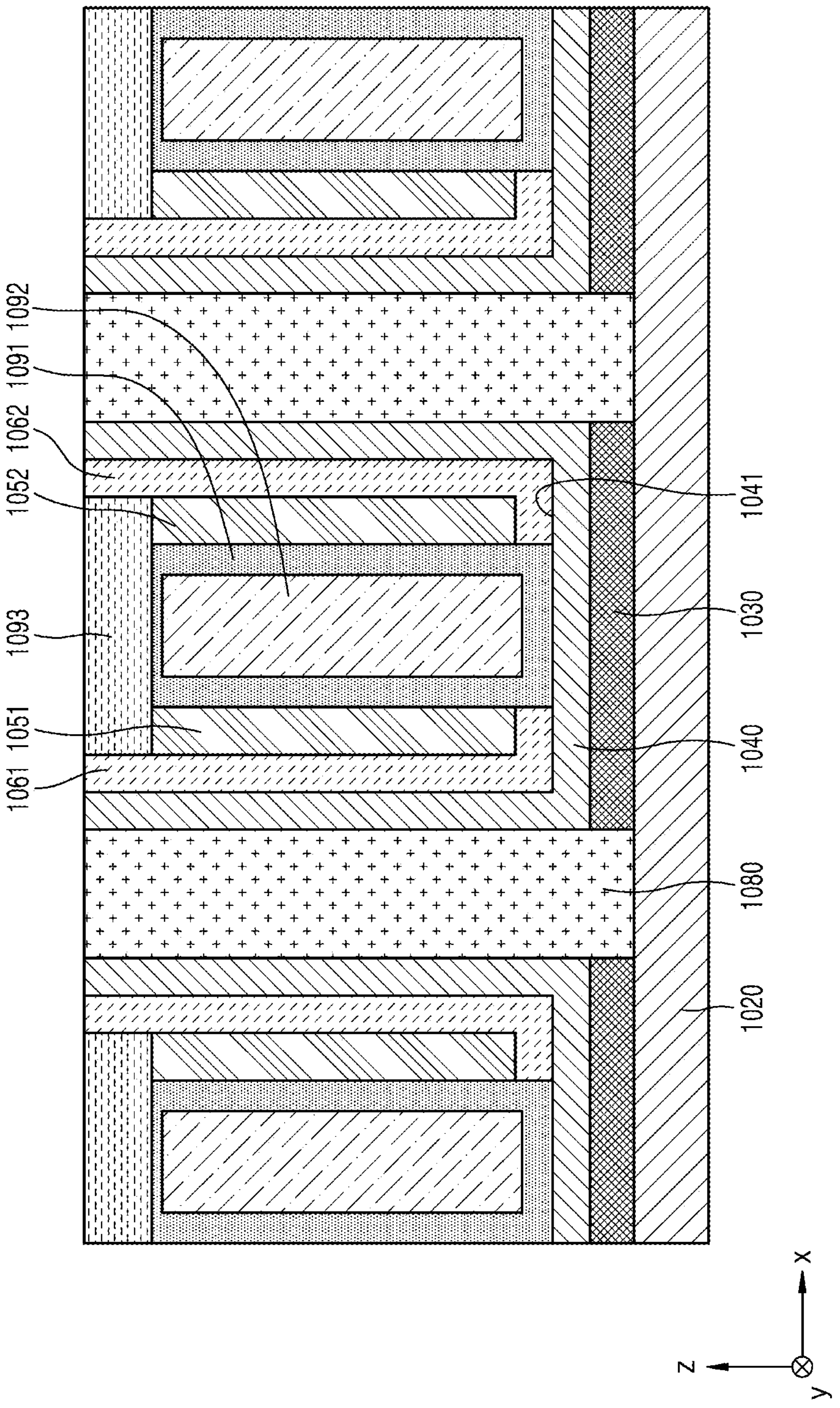

Referring to FIG. 19, when the gate electrode 1050 is etched once more, the level of the upper surfaces of the first gate electrode 1051 and the second gate electrode 1052 may be lower than the level of the upper surfaces of the mold insulating layers 1080.

Referring to FIG. 19, an insulating liner 1091 may be deposited from a surface of the bottom portion 1043 of the oxide semiconductor layer 1040 to the level of the upper surfaces of the first gate electrode 1051 and/or the second gate electrode 1052. A buried insulating layer 1092 may be filled inside the insulating liner 1091. The insulating liner 1091 and the filling insulating layer 1092 may not be distinguished from each other. An upper insulating layer 1093 may be deposited on an upper surface of the first gate electrode 1051 and/or the second gate electrode 1052 and an upper surface of the insulating liner 1091. A surface level of the upper insulating layer 1093 may match the levels of the upper surfaces of the mold insulating layers 1080, an upper surface of the oxide semiconductor layer 1040, the upper surfaces of the first gate electrode 1051 and the second gate electrode 1052, and the upper surfaces of the first gate insulating layer 1061 and the second gate insulating layer 1062.

Figure 20:
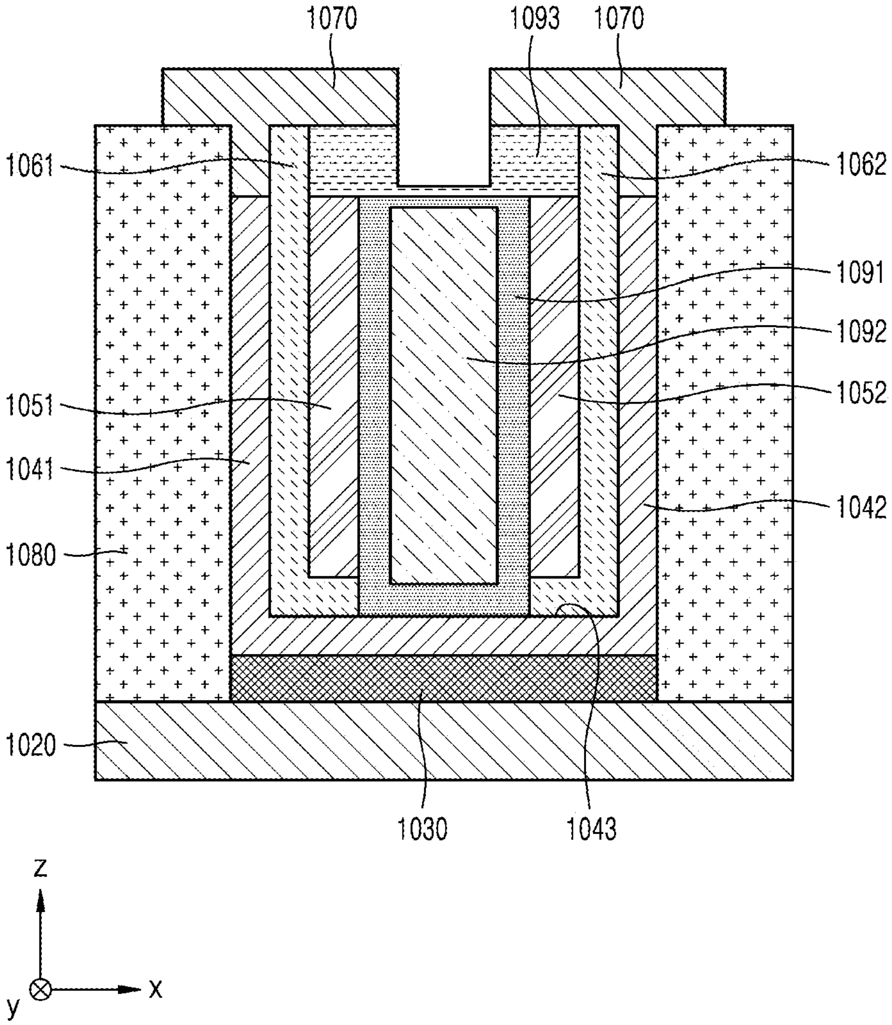

FIG. 20 illustrates only a portion corresponding to one pixel in FIG. 19 for convenience. Referring to FIG. 20, portions of upper portions of the first oxide semiconductor layer 1041 and the second oxide semiconductor layer 1042 may be etched, and an upper electrode 1070 may be deposited on the first oxide semiconductor layer 1041 and the second oxide semiconductor layer 1042. After depositing the upper electrode 1070, a center portion of the upper electrode 1070 and an upper portion of the upper insulating layer 1093 may be partially etched.

Figure 21:
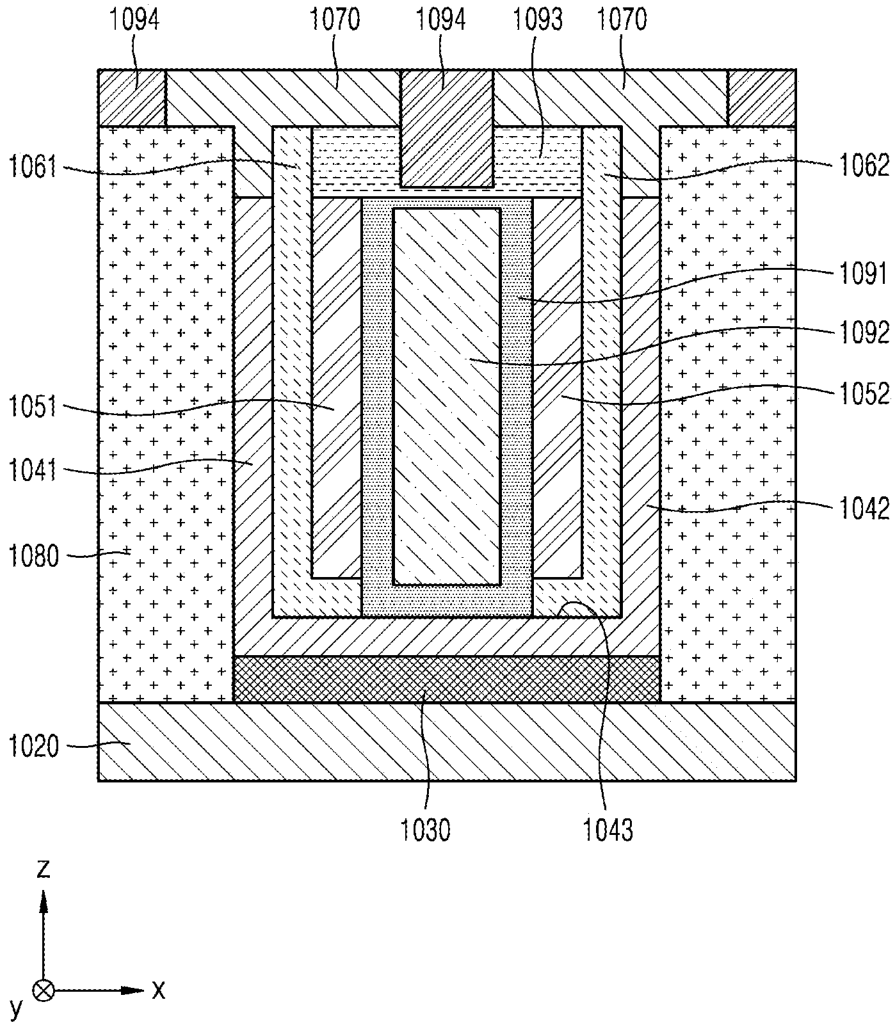

Referring to FIG. 21, an upper electrode insulating layer 1094 may be deposited between the upper electrodes 1070 and on a portion of the upper portion of the upper insulating layer 1093. An upper surface level of the upper electrode insulating layer 1094 may match a surface level of the upper electrode 1070.

Figure 22:
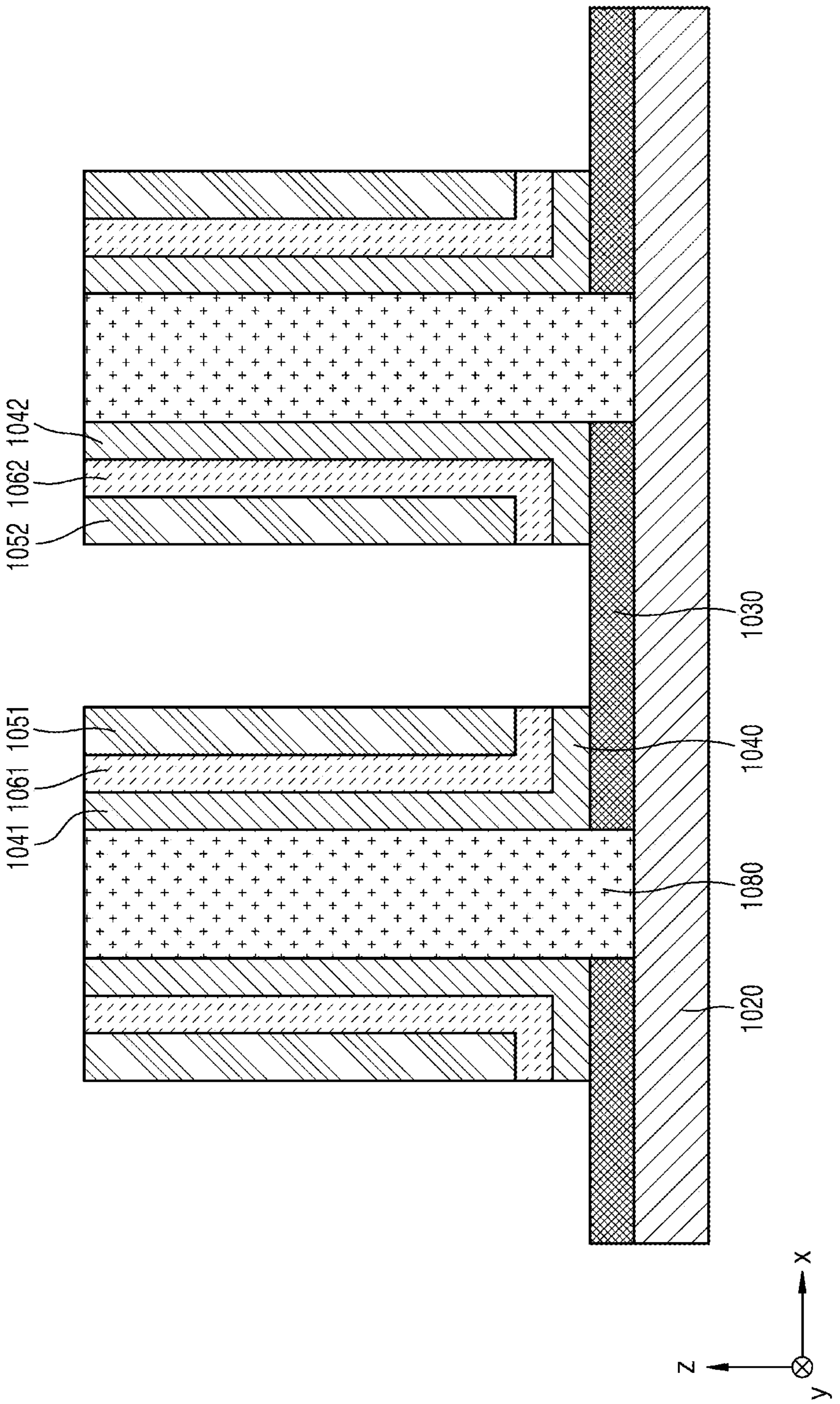

FIG. 22 is a diagram for explaining a method of manufacturing the semiconductor device 600 illustrated in FIG. 6. Hereinafter, descriptions provided above with reference to FIG. 18 will be omitted, and here, description will focus on the differences.

Referring to FIG. 22, the gate electrode 1050, the gate insulating layer 1060, and the oxide semiconductor layer 1040 may be etched toward a bottom portion of an opening, thereby exposing a portion of a surface of the buffer layer 1030. Thus, the oxide semiconductor layer 1040 may be separated into the first oxide semiconductor layer 1041 and the second oxide semiconductor layer 1042.

Figure 23:
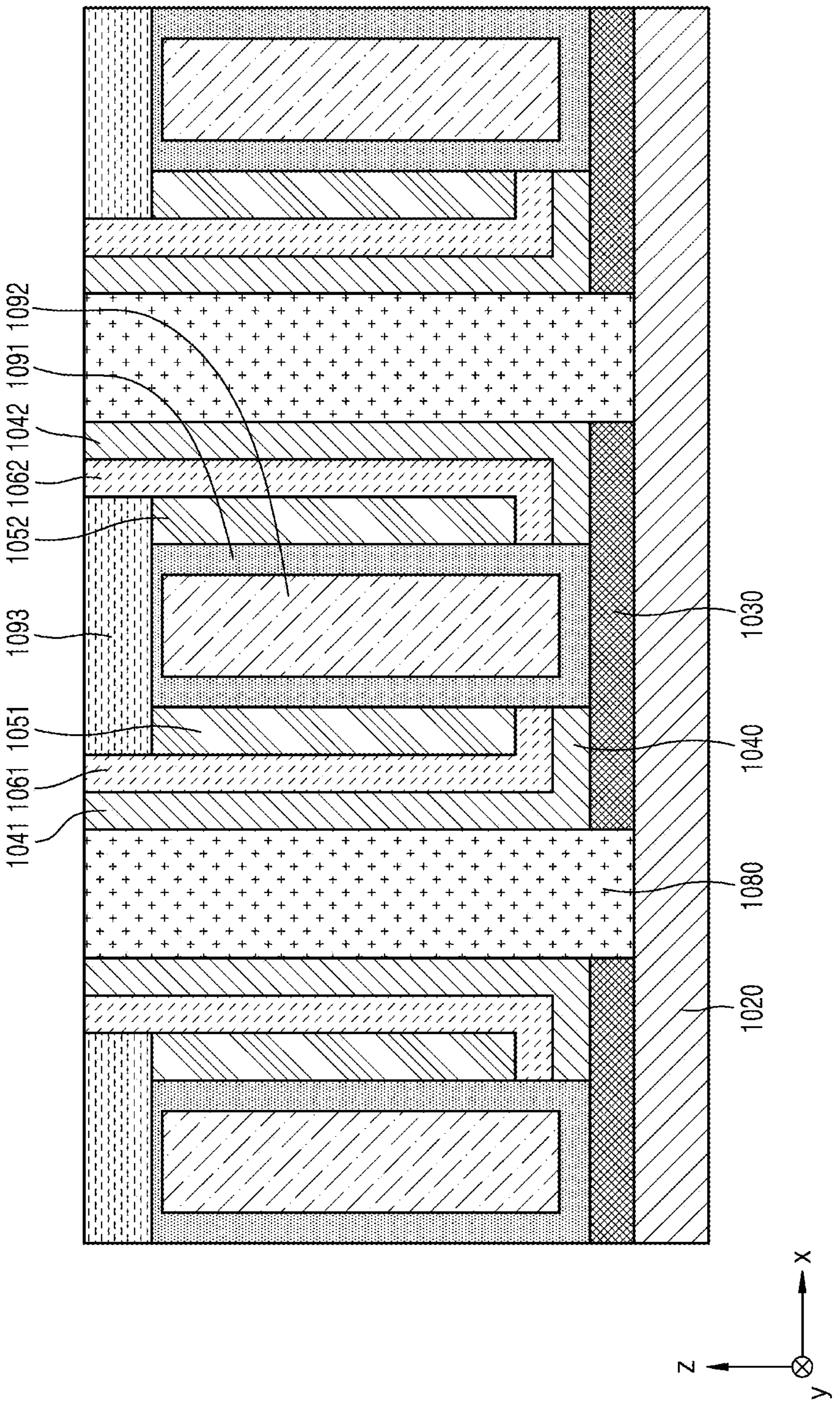

Referring to FIG. 23, the insulating liner 1091 may be deposited from an upper surface of the buffer layer 1030 to the level of the upper surfaces of the first gate electrode 1051 and/or the second gate electrode 1052.

Figure 24:
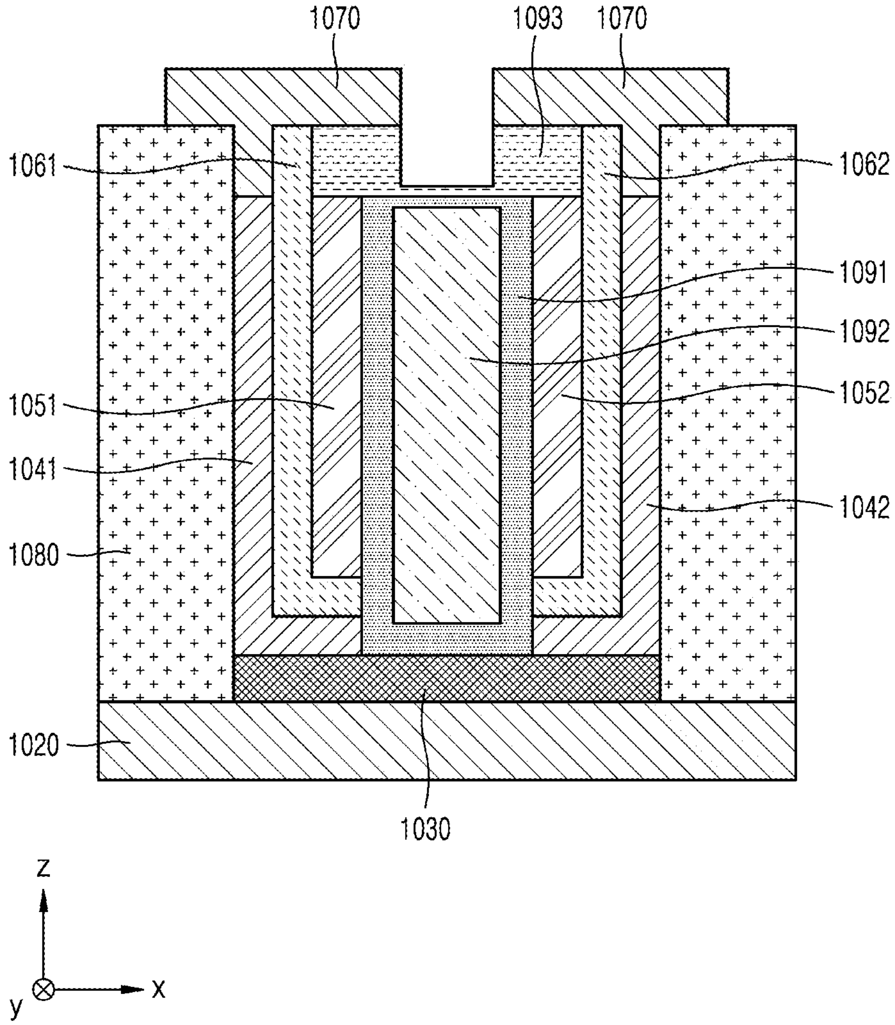

Referring to FIG. 24, similarly to FIG. 21, portions of the upper portions of the first oxide semiconductor layer 1041 and the second oxide semiconductor layer 1042 may be etched, and the upper electrode 1070 may be deposited on the first oxide semiconductor layer 1041 and the second oxide semiconductor layer 1042. After depositing the upper electrode 1070, the center portion of the upper electrode 1070 and the upper portion of the upper insulating layer 1093 may be partially etched.

Figure 25:
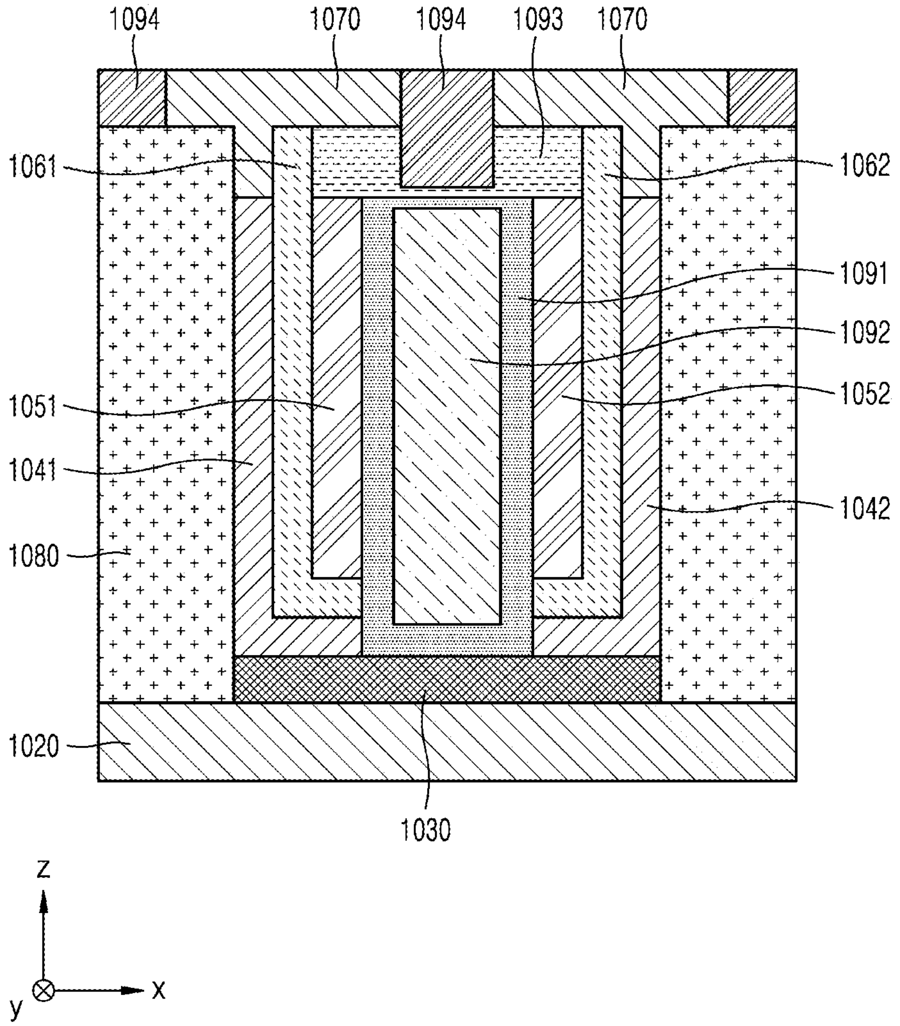

Referring to FIG. 25, similarly to FIG. 22, the upper electrode insulating layer 1094 may be deposited between the upper electrodes 1070 and on the portion of the upper portion of the upper insulating layer 1093. The upper surface level of the upper electrode insulating layer 1094 may match the surface level of the upper electrode 1070.

Figure 26:
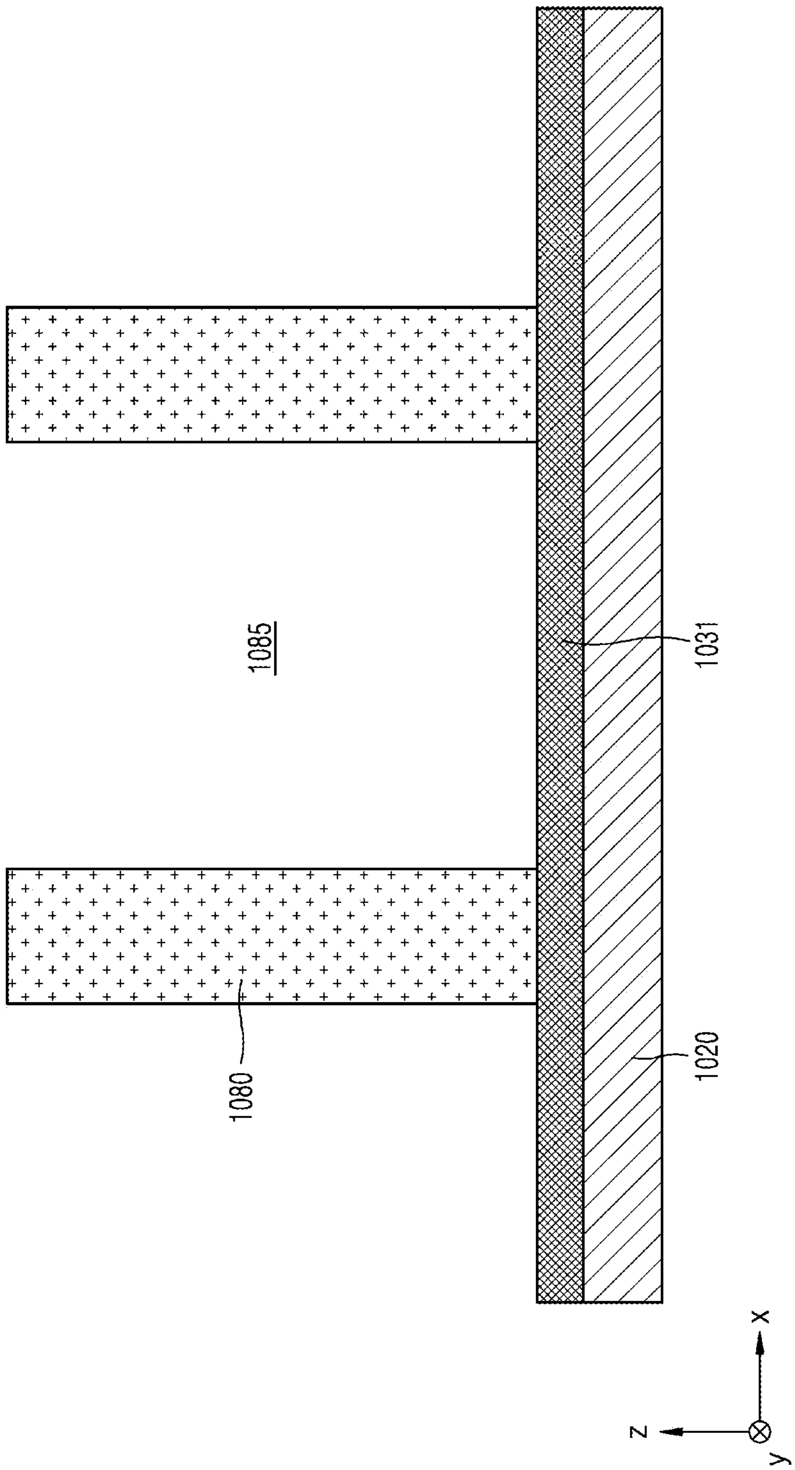

When compared with FIG. 14, in FIG. 26, only the buffer layer is modified. A buffer layer 1031 may be deposited on the lower electrode 1020. The buffer layer 1031 may be formed with an In precursor selectivity. The lower electrode 1020 may be formed as a bit line, and the buffer layer 1031 may be formed and patterned on the lower electrode 1020 of the bit line. The buffer layer 1031 may be formed by, for example, the ALD process using an In precursor.

According to the method of manufacturing a semiconductor device, according to some example embodiments, a buffer layer containing more indium than indium of an oxide semiconductor layer may be formed to reduce the non-uniformity in the interface composition, caused due to a decrease in indium content occurring at an interface between a lower electrode and the oxide semiconductor layer. In addition, improved contact characteristics may be provided and current deterioration may be prevented.

The semiconductor device according to some example embodiments has a very small size and excellent electrical performance, and thus is suitable for application to an integrated circuit device having a high degree of integration.

The semiconductor device according to some example embodiments may constitute a transistor constituting a digital circuit or an analog circuit. In some embodiments, the semiconductor device may be used as a high voltage transistor or a low voltage transistor. For example, the semiconductor device according to some example embodiments may constitute a high voltage transistor constituting a peripheral circuit of a flash memory device, an electrically erasable and programmable read only memory (EEPROM) device, or the like, which are non-volatile memory devices operating at a high voltage. In some example embodiments, the semiconductor device according to some example embodiments may constitute a transistor included in an IC chip for an electronic device including for example a liquid crystal display (LCD), an IC chip used in an LED display device or a micro LED display device or the like.

Figure 27:
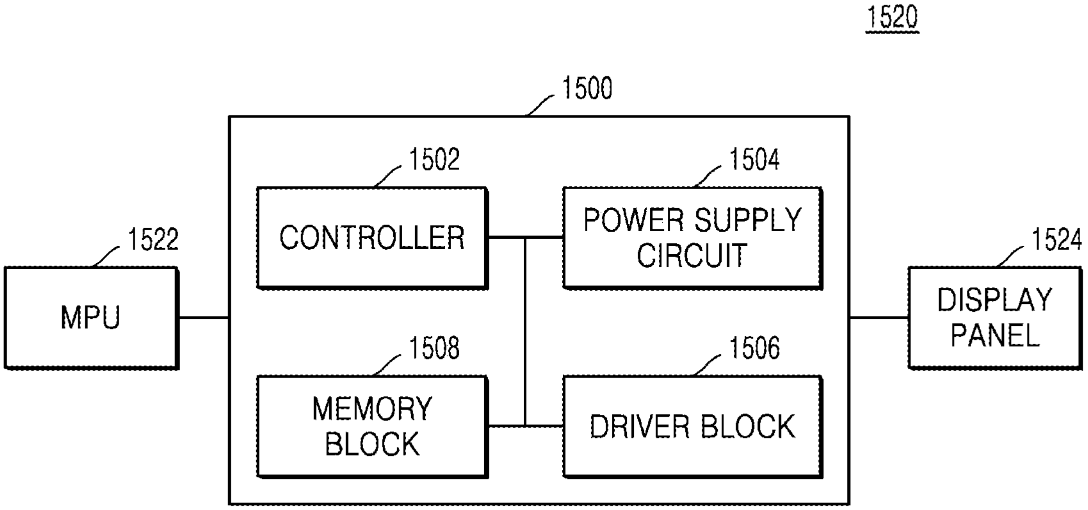
FIG. 27 is a schematic block diagram of a driving integrated circuit (DDI) including a semiconductor device according to some example embodiments, and a display device including the DDI according to some example embodiments.

FIG. 27 is a schematic block diagram of a driving integrated circuit (DDI) 1500 according to some example embodiments, and a display device 1520 including the DDI 1500.

Referring to FIG. 27, the DDI 1500 may include a controller 1502, a power supply circuit 1504, a driver block 1506, and a memory block 1508. The controller 1502 receives and decodes a command applied from a main processing unit (MPU) 1522, and controls each block of the DDI 1500 to implement an operation according to the command. The power supply circuit 1504 generates a driving voltage in response to the control by the controller 1502. The driver block 1506 drives the display panel 1524 by using the driving voltage generated by the power supply circuit 1504 in response to the control by the controller 1502. The display panel 1524 may include a liquid crystal display (LCD) panel, light emitting diode (LED) panel, organic LED (OLED) panel, or a micro LED device. The memory block 1508 may temporarily store commands input to the controller 1502 or control signals output from the controller 1502 or store necessary data, and may include memory such as RAM and ROM. The power supply circuit 1504 and the driver block 1506 may include semiconductor devices according to some example embodiments described above with reference to FIGS. 1A to 26.

Figure 28:
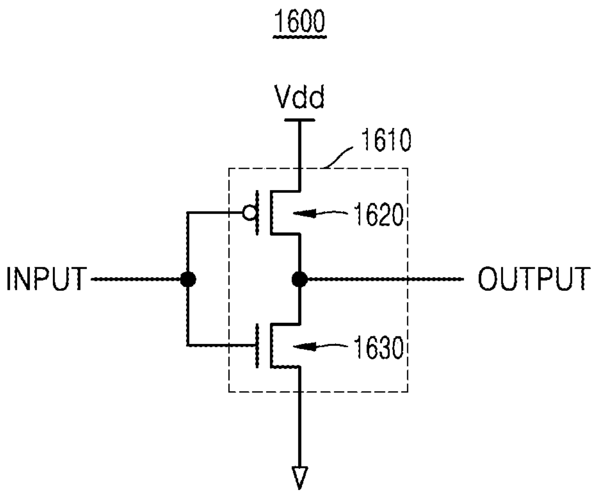
FIG. 28 is a circuit diagram of a complementary metal oxide semiconductor (CMOS) inverter including a semiconductor device according to some example embodiments.

FIG. 28 is a circuit diagram of an electronic device that includes a CMOS inverter 1600 according to some example embodiments.

The CMOS inverter 1600 includes a CMOS transistor 1610. The CMOS transistor 1610 includes a PMOS transistor 1620 and an NMOS transistor 1630 that are connected between a power terminal Vdd and a ground terminal. The CMOS transistor 1610 may include the semiconductor device according to some example embodiments described with reference to FIGS. 1A to 26.

Figure 29:
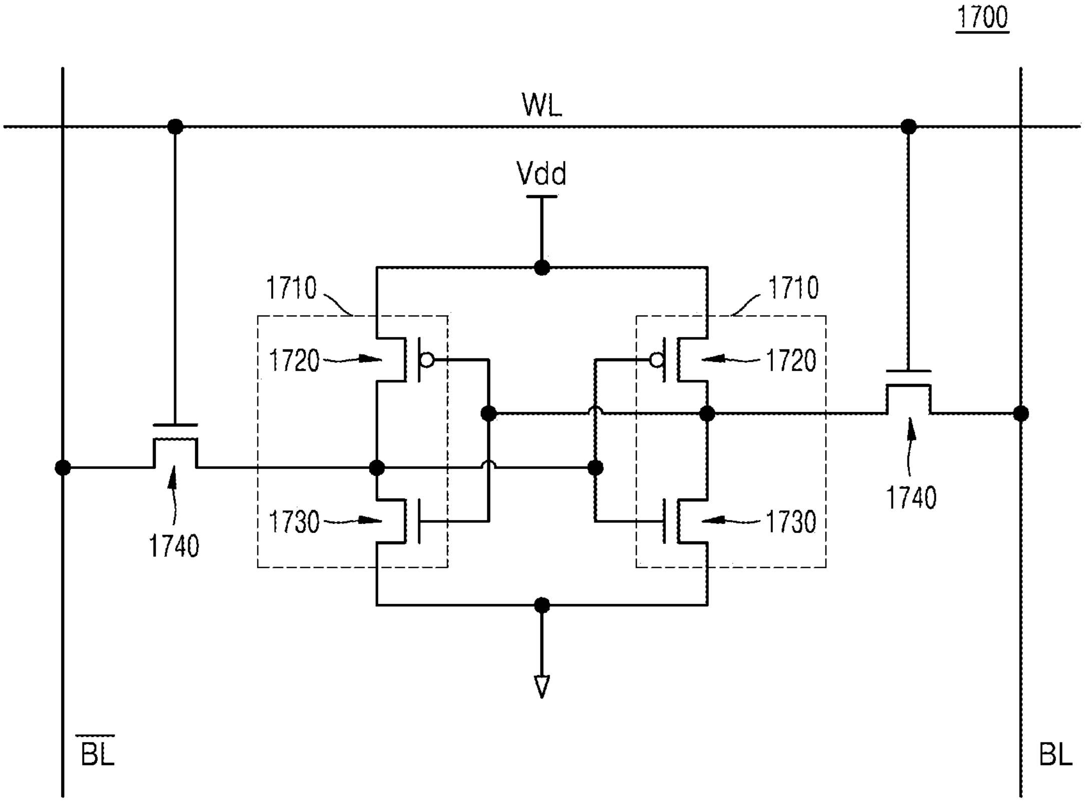
FIG. 29 is a circuit diagram of a CMOS static random access memory (SRAM) device including a semiconductor device according to some example embodiments.

FIG. 29 is a circuit diagram of a CMOS SRAM device 1700 according to some example embodiments.

The CMOS SRAM device 1700 includes a pair of driving transistors 1710. The pair of driving transistors 1710 includes a PMOS transistor 1720 and an NMOS transistor 1730 that are connected between a power terminal Vdd and a ground terminal. The CMOS SRAM device 1700 may further include a pair of transmission transistors 1740. Sources of the transmission transistors 1740 are cross-connected to a common node of the PMOS transistor 1720 and the NMOS transistor 1730 constituting the driving transistors 1710. The power terminal Vdd is connected to a source of the PMOS transistor 1720, and the ground terminal is connected to a source of the NMOS transistor 1730. A word line WL may be connected to a gate of the pair of transmission transistors 1740, and a bit line BL and an inverted bit line may be connected to drains of the pair of transmission transistors 1740, respectively.

At least one of the driving transistors 1710 and the transmission transistors 1740 of the CMOS SRAM device 1700 may include the semiconductor device according to some example embodiments described with reference to FIGS. 1A to 26.

Figure 30:
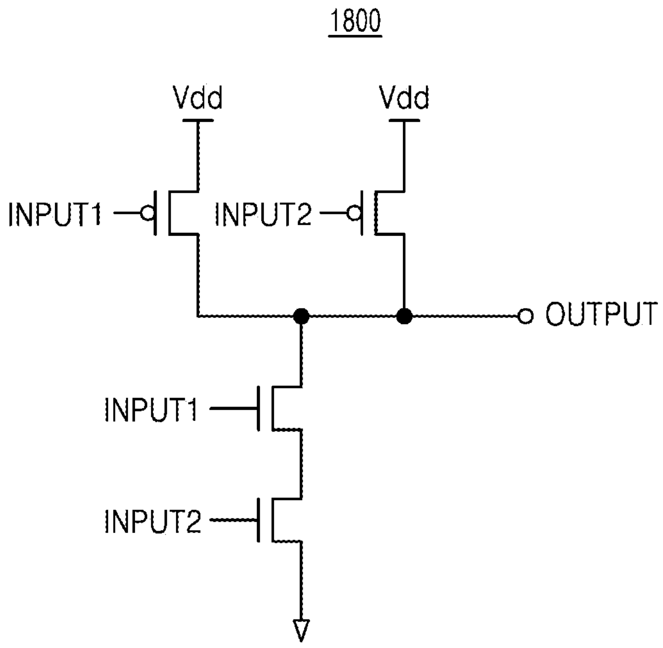
FIG. 30 is a circuit diagram of a CMOS NAND device including a semiconductor device according to some example embodiments.

FIG. 30 is a circuit diagram of an electronic device that includes a CMOS NAND circuit 1800 according to some example embodiments.

The CMOS NAND circuit 1800 includes a pair of CMOS transistors to which different input signals are transmitted. The CMOS NAND circuit 1800 may include the semiconductor device according to some example embodiments described with reference to FIGS. 1A to 26.

Figure 31:
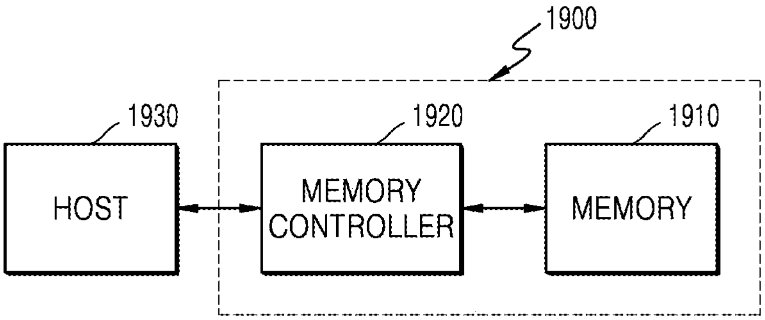
FIG. 31 is a block diagram of an electronic system including a semiconductor device according to some example embodiments.

FIG. 31 is a block diagram illustrating an electronic system 1900 (also referred to herein interchangeably as an electronic device) according to some example embodiments.

The electronic system 1900 includes a memory 1910 and a memory controller 1920. The memory controller 1920 may control the memory 1910 to read data from the memory 1910 and/or write data to the memory 1910, in response to a request by a host 1930. At least one of the memory 1910 or the memory controller 1920 may include the semiconductor device according to some example embodiments described with reference to FIGS. 1A to 26.

Figure 32:
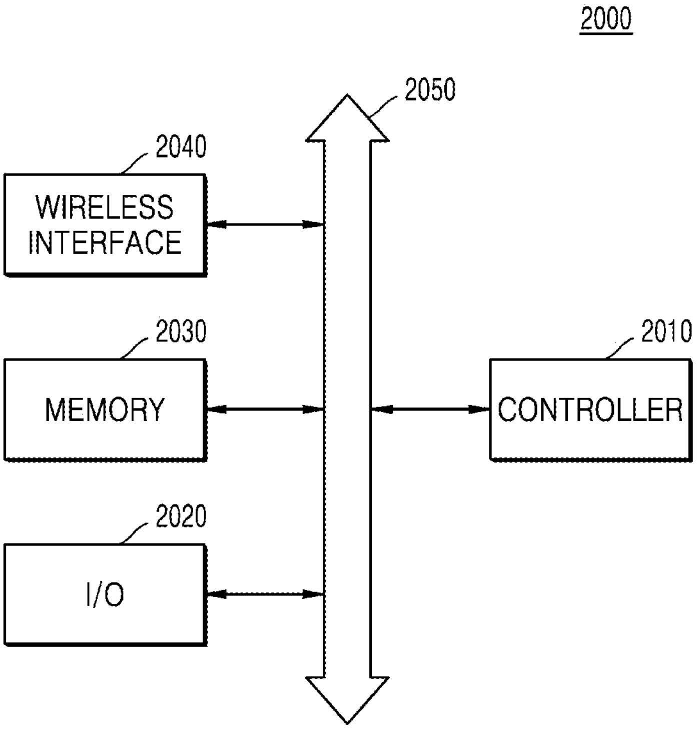
FIG. 32 is a block diagram of an electronic system including a semiconductor device according to some example embodiments.

FIG. 32 is a block diagram of an electronic system 2000 (also referred to herein interchangeably as an electronic device) according to some example embodiments.

The electronic system 2000 may configure a wireless communication device or a device capable of transmitting and/or receiving information in a wireless environment. The electronic system 2000 includes a controller 2010, an input/output device (I/O) 2020, a memory 2030, and a wireless interface 2040, which are respectively connected to one another through a bus 2050.

The controller 2010 may include at least one of a microprocessor, a digital signal processor, or a processing device similar thereto. The input/output device 2020 may include at least one of a keypad, a keyboard, or a display. The memory 2030 may be used to store commands executed by controller 2010. For example, the memory 2030 may be used to store user data. The electronic system 2000 may use a wireless interface 2040 to transmit/receive data over a wireless communication network. The wireless interface 2040 may include an antenna and/or a wireless transceiver. The electronic system 2000 may include the semiconductor device according to some example embodiments described with reference to FIGS. 1A to 26.

The semiconductor device according to some example embodiments may have a super compact size and have excellent electrical performance at the same time, and thus may be applied to integrated circuit devices, and may implement a compact size, low power consumption, and high performance.

The semiconductor device according to some example embodiments includes an In-containing buffer layer between a lower electrode and an oxide semiconductor layer, and thus, side reaction and interface composition separation induced during deposition of an oxide semiconductor may be reduced and improved contact characteristics may be provided. According to the method of manufacturing a semiconductor device, according to some example embodiments, an In-containing buffer layer may be formed between a lower electrode and an oxide semiconductor layer.

Any of the systems, devices, circuits, processors, modules, controllers, blocks, any portion thereof, or the like (e.g., DDI 1500, controller 1502, power supply circuit 1504, driver block 1506, memory block 1508, MPU 1522, display panel 1524, CMOS inverter 1600, CMOS SRAM device 1700, electronic system 1900, memory 1910, memory controller 1920, host 1930, electronic system 2000, controller 2010, input/output device (I/O) 2020, memory 2030, wireless interface 2040, any portion thereof, or the like) may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device, for example a solid state drive (SSD), storing a program of instructions, and a processor configured to execute the program of instructions to implement the functionality of any of the systems, devices, circuits, processors, modules, controllers, blocks, any portion thereof, or the like and/or to perform any of the methods according to any of the example embodiments.

It should be understood that example embodiments described herein should be considered in a descriptive sense only and not for purposes of limitation. Descriptions of features or aspects within each example embodiment should typically be considered as available for other similar features or aspects in other example embodiments. While some example embodiments have been described with reference to the figures, it will be understood by those of ordinary skill in the art that various changes in form and details may be made therein without departing from the spirit and scope as defined by the following claims.

What is claimed is:

1. A semiconductor device comprising:
- a substrate;
- a lower electrode on the substrate;
- a first buffer layer on the lower electrode, the first buffer layer including first indium;
- an oxide semiconductor layer on the first buffer layer, the oxide semiconductor layer including second indium;
- a gate insulating layer on the oxide semiconductor layer;
- a gate electrode on the gate insulating layer; and
- an upper electrode on the oxide semiconductor layer,
- wherein a content of the first indium in the first buffer layer is greater than a content of the second indium in the oxide semiconductor layer, wherein the first buffer layer is between the lower electrode and the oxide semiconductor layer, wherein the upper electrode and the lower electrode are spaced apart from each other in a perpendicular direction extending perpendicular to the substrate, wherein the oxide semiconductor layer includes a first area and a second area, wherein a distance from the first area of the oxide semiconductor layer to the first buffer layer is smaller than a distance from the second area of the oxide semiconductor layer to the first buffer layer, and wherein a content of the second indium in the first area of the oxide semiconductor layer is greater than a content of the second indium in the second area of the oxide semiconductor layer.

2. The semiconductor device of claim 1, wherein the first buffer layer is in contact with each of the lower electrode and the oxide semiconductor layer.

3. The semiconductor device of claim 1, wherein the first buffer layer comprises at least one of InGaZnO, InGaO, InSnO, InZnO, and InO.

4. The semiconductor device of claim 1, wherein the lower electrode includes Zn having a content of 10 at % or less.

5. The semiconductor device of claim 1, wherein Zn content in the first buffer layer is less than In content in the first buffer layer.

6. The semiconductor device of claim 1, wherein the first buffer layer has a thickness in a range from about 1 Å to about 50 Å.

7. The semiconductor device of claim 1, wherein the oxide semiconductor layer comprises an oxide comprising at least one of Zn, Sn, Ga, and Hf.

8. The semiconductor device of claim 1, further comprising a metal oxide layer between the lower electrode and the first buffer layer, wherein the metal oxide layer comprises a same metal as a metal included in the lower electrode.

9. The semiconductor device of claim 1, wherein the oxide semiconductor layer comprises InGaZnO, ZrInZnO, $InGaZnO_4$, ZnInO, $In_2O_3$, HfInZnO, or any combination thereof.

10. The semiconductor device of claim 1, wherein the oxide semiconductor layer comprises the second indium and zinc (Zn), and the content of the second indium in the oxide semiconductor layer is greater than or equal to a content of Zn in the oxide semiconductor layer.

11. The semiconductor device of claim 1, wherein the lower electrode comprises at least one of tungsten (W), cobalt (Co), nickel (Ni), iron (Fe), titanium (Ti), molybdenum (Mo), chromium (Cr), zirconium (Zr), hafnium (Hf), niobium (Nb), tantalum (Ta), silver (Ag), gold (Au), aluminum (Al), copper (Cu), tin (Sn), vanadium (V), ruthenium (Ru), platinum (Pt), zinc (Zn), or magnesium (Mg).

12. The semiconductor device of claim 1, wherein the gate electrode surrounds a circumference of the oxide semiconductor layer.

13. The semiconductor device of claim 1, further comprising a second buffer layer between the oxide semiconductor layer and the upper electrode.

14. The semiconductor device of claim 1, wherein the first buffer layer is in contact with a side surface of the lower electrode, and at least a portion of the oxide semiconductor layer is offset from the lower electrode and the upper electrode in a horizontal direction that extends parallel with the substrate, and the portion of the oxide semiconductor layer extends in the perpendicular direction between at least a first position that overlaps the lower electrode in the horizontal direction and a second position that overlaps the upper electrode in the horizontal direction.

15. The semiconductor device of claim 1, wherein the oxide semiconductor layer, the gate insulating layer, and the gate electrode are arranged such that the oxide semiconductor layer, the gate insulating layer, and the gate electrode have respective length directions that are parallel with each other and parallel to the perpendicular direction, and the oxide semiconductor layer, the gate insulating layer, and the gate electrode are arranged in a horizontal direction extending parallel with the substrate such that the oxide semiconductor layer, the gate insulating layer, and the gate electrode at least partially overlap with each other in the horizontal direction.

16. The semiconductor device of claim 1, wherein the oxide semiconductor layer has a U-shaped cross-section.

17. The semiconductor device of claim 1, wherein the oxide semiconductor layer comprises a first oxide semiconductor layer that has an L-shape having a length dimension and a width dimension extending perpendicular to each other such that the length dimension of the first oxide semiconductor layer extends in the perpendicular direction, and a second oxide semiconductor layer that is symmetrically arranged with respect to the first oxide semiconductor layer with respect to the perpendicular direction such that the first oxide semiconductor layer and the second oxide semiconductor layer have reflection symmetry around a first axis of symmetry that extends in the perpendicular direction, and the gate electrode comprises a first gate electrode having a length dimension that extends in the perpendicular direction, and a second gate electrode that is symmetrically arranged with respect to the first gate electrode with respect to the perpendicular direction such that the first gate electrode and the second gate electrode have reflection symmetry around a second axis of symmetry that extends in the perpendicular direction.

18. The semiconductor device of claim 1, wherein the lower electrode, the first buffer layer, and the oxide semiconductor layer have a same width as each other.

19. A method of manufacturing a semiconductor device, the method comprising:

arranging a lower electrode on a substrate;

depositing, on the lower electrode, a buffer layer including first indium;

depositing, on the buffer layer, an oxide semiconductor layer including second indium;

depositing a gate insulating layer on the oxide semiconductor layer;

depositing a gate electrode on the gate insulating layer; and depositing an upper electrode on the oxide semiconductor layer, wherein a content of the first indium in the buffer layer is greater than a content of the second indium in the oxide semiconductor layer, wherein the buffer layer is between the lower electrode and the oxide semiconductor layer, wherein the upper electrode and the lower electrode are spaced apart from each other in a perpendicular direction that extends perpendicular to the substrate, wherein the oxide semiconductor layer includes a first area and a second area, wherein a distance from the first area of the oxide semiconductor layer to the buffer layer is smaller than a distance from the second area of the oxide semiconductor layer to the buffer layer, and wherein a content of the second indium in the first area of the oxide semiconductor layer is greater than a content of the second indium in the second area of the oxide semiconductor layer.

20. The method of claim 19, wherein the buffer layer is in contact with each of the lower electrode and the oxide semiconductor layer.

21. The method of claim 19, wherein the buffer layer comprises at least one of InGaZnO, InGaO, InSnO, InZnO, and InO.

22. The method of claim 19, wherein the buffer layer has a thickness in a range from about 1 Å to about 50 Å.

23. The method of claim 19, wherein the depositing of the buffer layer on the lower electrode comprises an atomic layer deposition (ALD) process.

24. The method of claim 19, wherein the depositing of the oxide semiconductor layer comprises an atomic layer deposition (ALD) process.

25. The method of claim 19, wherein the lower electrode comprises Zn having a content of 10 at % or less.

26. The method of claim 19, wherein Zn content in the buffer layer is less than In content in the buffer layer.

* * * * *